(12) United States Patent
Einav

(10) Patent No.: US 8,945,302 B2
(45) Date of Patent: Feb. 3, 2015

(54) METHOD FOR CRYSTAL GROWTH OF A METAL-NONMETAL COMPOUND USING A METALLOPHOBIC-METALLOPHILIC SURFACTANT AND A THIN METAL WETTING LAYER

(75) Inventor: Moshe Einav, Kfar Uriyah (IL)

(73) Assignee: Mosaic Crystals Ltd., Herzliya (IL)

( * ) Notice: Subject to any disclaimer, the term of this patent is extended or adjusted under 35 U.S.C. 154(b) by 0 days.

(21) Appl. No.: 14/002,820

(22) PCT Filed: Mar. 4, 2012

(86) PCT No.: PCT/IL2012/000103
§ 371 (c)(1),
(2), (4) Date: Sep. 3, 2013

(87) PCT Pub. No.: WO2012/120497
PCT Pub. Date: Sep. 13, 2012

(65) Prior Publication Data
US 2013/0333613 A1    Dec. 19, 2013

Related U.S. Application Data

(60) Provisional application No. 61/449,421, filed on Mar. 4, 2011.

(51) Int. Cl.
*C30B 19/04* (2006.01)
*C30B 19/00* (2006.01)
(Continued)

(52) U.S. Cl.
CPC . *C30B 19/00* (2013.01); *C30B 9/00* (2013.01); *C30B 23/00* (2013.01); *C30B 25/00* (2013.01);
(Continued)

(58) Field of Classification Search
CPC ........ C30B 19/00; C30B 19/02; C30B 19/04; C30B 19/10; C30B 19/12; C30B 23/00; C30B 23/002; C30B 23/02; C30B 23/06; C30B 25/00; C30B 25/02; C30B 25/06; C30B 25/10; C30B 25/16; C30B 25/165
USPC ................. 117/11, 53–56, 58, 63–65, 67, 84, 117/88–90, 92–94, 102–103, 105–106, 108, 117/937, 951–952; 438/507, 509, 761–763, 438/765, 767
See application file for complete search history.

(56) References Cited

U.S. PATENT DOCUMENTS 7,097,707 B2 *  8/2006  Xu .................................. 117/13
7,892,513 B2 *  2/2011  Fujiwara et al. ............... 423/409
(Continued)

FOREIGN PATENT DOCUMENTS

EP       1 803 839 A1    7/2007
WO    2008102358 A2    8/2008
(Continued)

OTHER PUBLICATIONS

N. Gogneau, et al. publication entitled "Surfactant effect of gallium during the growth of GaN on AlN(000-1) by plasma-assisted molecular beam epitaxy," Applied Physics Letters, vol. 85, pp. 1421-23 (2004).*

(Continued)

*Primary Examiner* — Michael Kornakov
(74) *Attorney, Agent, or Firm* — Brown Rudnick LLP

(57) ABSTRACT

Method for crystal growth from a surfactant of a metal-nonmetal (MN) compound, including the procedures of providing a seed crystal, introducing atoms of a first metal to the seed crystal thus forming a thin liquid metal wetting layer on a surface of the seed crystal, setting a temperature of the seed crystal below a minimal temperature required for dissolving MN molecules in the wetting layer and above a melting point of the first metal, each one of the MN molecules being formed from an atom of a second metal and an atom of a first nonmetal, introducing the MN molecules which form an MN surfactant monolayer, thereby facilitating a formation of the wetting layer between the MN surfactant monolayer and the surface of the seed crystal, and regulating a thickness of the wetting layer, thereby growing an epitaxial layer of the MN compound on the seed crystal.

36 Claims, 7 Drawing Sheets

(51) Int. Cl.

| | | |
|---|---|---|
| *C30B 9/00* | (2006.01) | |
| *C30B 23/00* | (2006.01) | |
| *C30B 25/00* | (2006.01) | |
| *C30B 29/40* | (2006.01) | |
| *C30B 19/06* | (2006.01) | |
| *C30B 19/10* | (2006.01) | |
| *C30B 25/16* | (2006.01) | |
| *C30B 7/00* | (2006.01) | |
| *C30B 23/02* | (2006.01) | |
| *C30B 25/02* | (2006.01) | |

(52) U.S. Cl.
CPC ............... *C30B 29/40* (2013.01); *C30B 19/068* (2013.01); *C30B 19/10* (2013.01); *C30B 23/002* (2013.01); *C30B 25/16* (2013.01); *C30B 7/005* (2013.01); *C30B 23/02* (2013.01); *C30B 25/02* (2013.01)
USPC .................. 117/58; 117/11; 117/53; 117/54; 117/55; 117/56; 117/63; 117/64; 117/65; 117/67; 117/84; 117/88; 117/89; 117/90; 117/92; 117/93; 117/94; 117/102; 117/103; 117/105; 117/106; 117/107; 117/108; 438/507; 438/509; 438/761; 438/762; 438/763; 438/765; 438/767

(56) References Cited

U.S. PATENT DOCUMENTS

| | | | |
|---|---|---|---|
| 8,491,718 B2 | 7/2013 | Chaudhari | |
| 2003/0213964 A1* | 11/2003 | Flynn et al. | ..................... 257/85 |
| 2004/0003495 A1 | 1/2004 | Xu | |
| 2009/0297774 A1* | 12/2009 | Chaudhari | ................... 428/149 |
| 2010/0237272 A1 | 9/2010 | Chaudhari | |

FOREIGN PATENT DOCUMENTS

| | | |
|---|---|---|
| WO | WO 2008102358 A2 * | 8/2008 |
| WO | 2012120497 A1 | 9/2012 |

OTHER PUBLICATIONS

Gogneau et al., "Surfactant effect of gallium during the growth of GaN on AIN(0001) by plasma assisted molecular beam epitaxy," published in Applied Physics Letters, vol. 85, No. 8, Aug. 23, 2004.

International Preliminary Report on Patentability (IPRP) for PCT/IL2012/000103, Seven pages.

International Search Report (ISR) / Written Opinion (WO) for PCT/IL2012/000103, Eleven pages.

Chaudhari, P. et al., Heteroepitaxial Silicon Film Growth at 600C From An Al-Si Eutectic Melt, pp. 5368-5371, Mar. 19, 2010, Thin Solid Films 518, Elsevier, US.

\* cited by examiner

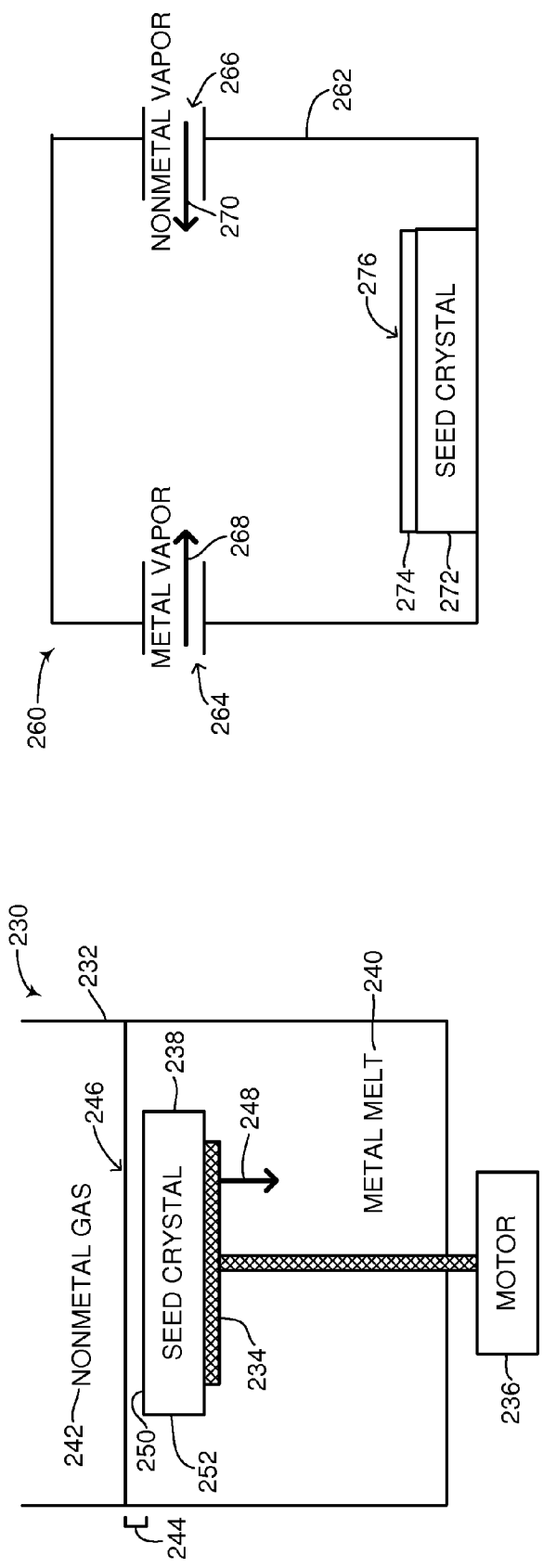
FIG. 3B
FIG. 3A
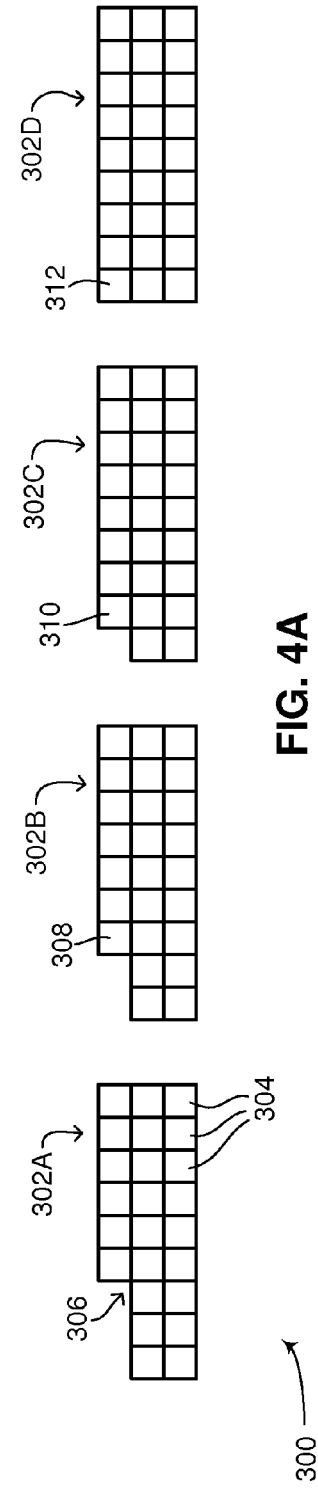
FIG. 4A

METHOD FOR CRYSTAL GROWTH OF A METAL-NONMETAL COMPOUND USING A METALLOPHOBIC-METALLOPHILIC SURFACTANT AND A THIN METAL WETTING LAYER

CROSS REFERENCE

This claims priority from and is a U.S. national stage filing of PCT International Patent Application Number PCT/IL2012/000103, filed on Mar. 4, 2012, which itself claims priority from U.S. Provisional Patent Application No. 61/449,421, filed on Mar. 4, 2011, and the entirety of each of these applications is incorporated herein by reference.

FIELD OF THE DISCLOSED TECHNIQUE

The disclosed technique relates to crystal growth, in general, and to methods and systems for growing crystals of a metal-nonmetal compound using surfactants, in particular.

BACKGROUND OF THE DISCLOSED TECHNIQUE

Methods for growing crystals from a liquid melt are known in the art. For example, U.S. Pat. No. 7,097,707, issued to Xu, entitled "GaN boule grown from liquid melt using GaN seed wafers" is directed to methods for making single crystal GaN boules. A first method comprises the procedures of contacting a GaN seed wafer with a GaN source environment under process conditions. The process conditions include a thermal gradient in the GaN source environment for producing growth of gallium nitride on the GaN seed wafer, thus forming the GaN boule. The source environment can be selected from a gallium melt and a nitrogen source or a supercritical ammonia containing solubilized GaN.

A second method comprises the procedures of providing a gallium melt and contacting a GaN seed wafer with the gallium melt in the presence of a nitrogen source and under a thermal gradient. This produces the growth of gallium nitride on the GaN seed wafer, thereby forming a GaN boule. The GaN seed wafer is attached to a rotatable rod. The rotatable rod is rotated, thus rotating the GaN seed wafer, while pulling the rod and the GaN seed wafer from the gallium melt during the growth of the GaN boule. The nitrogen source comprises a nitrogen plasma including atomic nitrogen, nitrogen ions and dinitrogen ions. Also an ambient environment is formed of the gallium melt and the GaN seed wafer. The nitrogen plasma is generated by a discharge technique selected from direct current discharge, radio frequency discharge and microwave discharge. The temperature of the gallium melt is from about 900° C. to about 1500° C. A GaN crust is formed on a surface of the gallium melt, from the reaction between the nitrogen source and the gallium melt. The thermal gradient comprises a temperature which is higher at the GaN crust than at the GaN seed layer, whereby gallium nitride is transported from the crust to the growth of gallium nitride on the GaN seed wafer via dissolved atomic nitrogen in the gallium melt. The GaN in the crust is decomposed into atomic nitrogen with an equilibrium concentration at the temperature at the crust. The atomic nitrogen equilibrium concentration is at supersaturation relative to the temperature at the GaN seed wafer, thus producing homoepitaxial growth of GaN at the seed wafer.

U.S. Pat. No. 7,892,513, issued to Fujiwara, et al., entitled "Group III nitride crystal and method of its growth" is directed to a crystal growth method. The method comprises the steps of preparing a substrate having a principal face and including, at least on its principal face side, a group III nitride seed crystal having the same chemical composition as a group III nitride crystal. The average density of threading dislocations along the principal face is $5 \times 10^6$ cm$^{-2}$ or less. The method further comprises the step of bringing a solution, in which a nitrogen containing gas is dissolved into a group III metal containing solvent, into contact with the principal face of the substrate, to grow the group III nitride crystal onto the principal face of the substrate.

PCT International Patent Application Publication No. WO 2008/102358 A2, to Einav, assigned to Mosaic Crystals, entitled "Group-III Metal Nitride and Preparation Thereof" is directed to a method for forming a group-III metal nitride material film attached to a substrate. The method includes the procedures of subjecting the substrate to an ambient pressure of no greater than 0.01 pascals (Pa) and heating the substrate to a temperature of approximately between 500° C.-800° C. The method further includes the procedures of introducing a group-III metal vapor to the surface of the substrate at a base pressure of at least 0.01 Pa until a plurality of group-III metal drops form on the surface and introducing active nitrogen to the surface at a working pressure of between 0.05-2.5 Pa until group-III metal nitride molecules form on the group-III metal drops. The method further includes the procedure of maintaining the working pressure and the active nitrogen until the group-III metal nitride molecules diffuse into the group-III metal drops thus forming nitride/metal solution drops. The method finally includes the procedures of maintaining the working pressure and the active nitrogen until the nitride/metal solution drops turn into a wetting layer on the substrate and continuing to increase the concentration of group-III metal nitride molecules in the wetting layer until all the group-III metal atoms contained in the wetting layer are exhausted, and the wetting layer transforms into a group-III metal nitride film.

EPO Patent Application Publication No. EP 1 803 839 A1, to Kasai et al., assigned to Sumitomo Electric Industries, entitled "Fabrication method and fabrication apparatus of group III nitride crystal substance" is directed to a fabrication method of a group III nitride crystal substance. The method includes the steps of cleaning the interior of a reaction chamber by introducing HCl gas into the reaction chamber and then vapor deposition of a group III nitride crystal substance in the cleaned reaction chamber. The HCl gas effectively cleans deposits adhering to the interior of the reaction chamber during crystal growth. The step of cleaning the interior of the reaction chamber can be carried out under the conditions that the HCl gas partial pressure is at least 1.013 hectopascals (hPa) and not more than 1013 hPa, and the temperature in the reaction chamber is at least 650° C. and not more than 1200° C.

The apparatus includes a reaction chamber formed in a reactor tube, a group III element raw material gas generation chamber, an HCl gas introduction pipe to introduce HCl gas into the reaction chamber, an HCl gas introduction pipe to introduce HCl gas to the group III element raw material gas generation chamber, a group III element raw material gas introduction pipe to introduce the group III raw material gas generated at the group III element raw material gas generation chamber into the reaction chamber, a nitrogen raw material gas introduction pipe to introduce nitrogen raw material gas into the reaction chamber, a gas exhaust pipe to discharge gas from the reaction chamber and a substrate holder to dispose an underlying substrate to grow a group III nitride crystal substance in the reaction chamber. The reaction chamber includes a crystal growth zone that is the region in close proximity to a substrate holder. A protection member of the reaction chamber can be disposed on the inner wall of the reaction chamber at this crystal growth zone. Furthermore a device to trap ammonium chloride can be attached at the inlet and/or outlet of the gas exhaust pipe. The configuration is used to grow a group III nitride crystal substance by HVPE.

An article to Gogneau et al., entitled "Surfactant effect of gallium during the growth of GaN on AlN(0001) by plasma-assisted molecular beam epitaxy," published in Applied Physics Letters, Vol. 85, No. 8, Aug. 23, 2004, is directed to the study of a growth mode of N-face GaN(0001) deposited on an AlN(0001) substrate by plasma-assisted molecular beam epitaxy (PAMBE). With a substrate temperature of 730° C. and a gallium (Ga) flux of ≥0.09 ML/s, Gogneau et al. demonstrated that Ga droplets begin to form on the surface of the AlN(0001) substrate, thus resulting in the formation of a 1 ML dynamically stable Ga film on the surface of the AlN (0001) substrate. The role of the excess Ga during epitaxial growth of GaN was then determined by monitoring the variation of the Bragg spot intensity in the RHEED pattern during the deposition as a function of the GaN deposition time and impinging Ga fluxes. According to the variations in the Bragg spot intensity in the RHEED pattern, Gogneau et al. were able to determine that the Ga in the Ga film behaves as a surfactant during the growth of GaN on AlN(0001) by PAMBE.

SUMMARY OF THE PRESENT DISCLOSED TECHNIQUE

It is an object of the disclosed technique to provide a novel method of crystal growth for growing high quality metal-nonmetal compound crystals from a surfactant which rests above a thin liquid metal wetting layer. In accordance with the disclosed technique, there is thus provided a method for crystal growth from a surfactant of a metal-nonmetal (MN) compound, including the procedures of providing a seed crystal and introducing atoms of a first metal to the seed crystal in order to form a thin liquid metal wetting layer on at least one surface of the seed crystal. The method also includes the procedure of setting a temperature of the seed crystal below a minimal temperature required for dissolving MN molecules in the thin liquid metal wetting layer and above a melting point of the first metal. Each one of the MN molecules is formed from at least one atom of a second metal and at least one atom of a first nonmetal. The method further includes the procedure of introducing the MN molecules which form an MN surfactant monolayer, thereby facilitating a formation of the thin liquid metal wetting layer between the MN surfactant monolayer and the surface of the seed crystal. The method finally includes the procedure of regulating a thickness of the thin liquid metal wetting layer such that at least some of the MN molecules of the MN surfactant monolayer couple with the surface of the seed crystal, thereby growing an epitaxial layer of the MN compound on the seed crystal.

In accordance with another aspect of the disclosed technique, there is thus provided a method for crystal growth from a surfactant of a metal-nonmetal (MN) compound from a metal melt in a growth chamber. The growth chamber includes a pedestal and a motor. The pedestal is located inside the growth chamber. The motor is coupled with the pedestal and is for moving the pedestal in the growth chamber. The method includes the procedures of placing a seed crystal on the pedestal such that a growth surface of the seed crystal faces opposite a direction of the pedestal and filling the growth chamber with the metal melt such that the growth surface is covered by a thin layer of the metal melt. The method also includes the procedure of introducing a nonmetal gas into the growth chamber above a surface of the metal melt. Particles of the nonmetal gas and particles of the metal melt interact, thereby forming a MN surfactant monolayer. The method finally includes the procedure of regulating a distance between the growth surface and the MN surfactant monolayer such that molecules in the MN surfactant monolayer tunnel to the growth surface, thereby epitaxially growing at least one crystal layer on the growth surface.

In accordance with a further aspect of the disclosed technique, there is thus provided a method for crystal growth from a surfactant of a metal-nonmetal (MN) compound from a thin film in a growth chamber. The growth chamber includes a first gas inlet and a second gas inlet. The first gas inlet is coupled with the growth chamber and is for introducing a metal vapor into the growth chamber. The second gas inlet is also coupled with the growth chamber and is for introducing a nonmetal vapor into the growth chamber. The method includes the procedures of placing a seed crystal in the growth chamber and simultaneously filling the growth chamber with the metal vapor and the nonmetal vapor, such that the metal vapor and the nonmetal vapor co-deposit on a growth surface of the seed crystal, thereby forming a thin liquid metal wetting layer from the metal vapor and a MN surfactant monolayer over the thin liquid metal wetting layer. A concentration of the metal vapor is initially higher than a concentration of the nonmetal vapor such that the thin liquid metal wetting layer is formed. The method also includes the procedure of regulating a thickness of the thin liquid metal wetting layer such that MN molecules in the MN surfactant monolayer tunnel to the growth surface, thereby epitaxially growing at least one crystal layer on the growth surface.

BRIEF DESCRIPTION OF THE DRAWINGS

The disclosed technique will be understood and appreciated more fully from the following detailed description taken in conjunction with the drawings in which:

FIG. 3A is a schematic illustration of a system for growing a metal-nonmetal compound crystal using the method of FIG. 1, constructed and operative in accordance with another embodiment of the disclosed technique;

FIG. 3B is a schematic illustration of another system for growing a metal-nonmetal compound crystal using the method of FIG. 1, constructed and operative in accordance with a further embodiment of the disclosed technique;

FIG. 4A is a schematic illustration of a crystal grown epitaxially, constructed and operative in accordance with another embodiment of the disclosed technique;

DETAILED DESCRIPTION OF THE EMBODIMENTS

Figure 1:
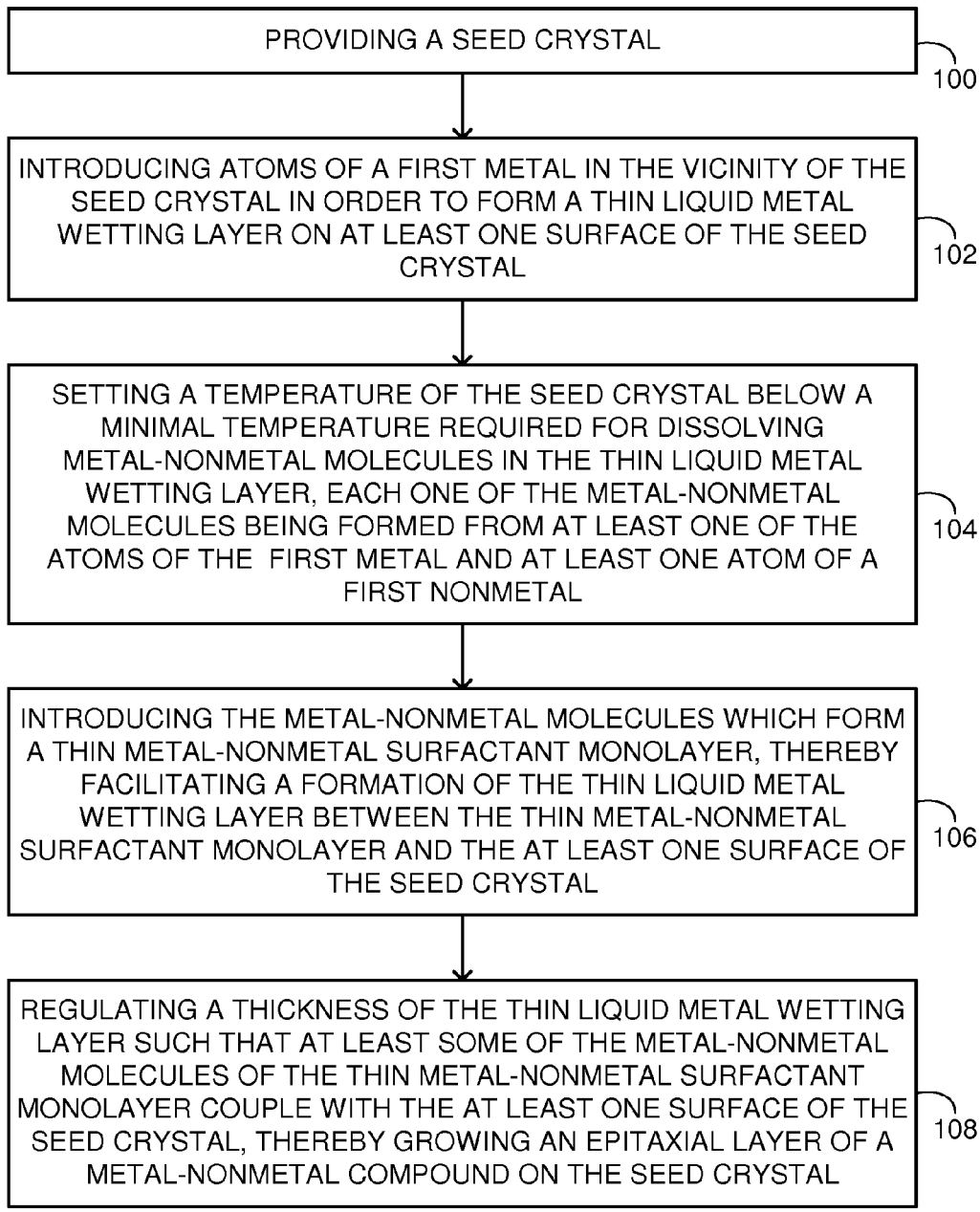
FIG. 1 is a schematic illustration of a method for growing crystals of a metal-nonmetal compound from a surfactant, operative in accordance with an embodiment of the disclosed technique.

The disclosed technique overcomes the disadvantages of the prior art by providing a novel crystal growth method for growing high quality metal-nonmetal compound crystals from a surfactant which rests above a thin liquid metal wetting layer. According to the disclosed technique, a thin liquid metal wetting layer is provided with nonmetal atoms or metal-nonmetal particles which do not dissolve in the thin liquid metal wetting layer. The nonmetal atoms and particles combine with metal atoms and particles of the thin liquid metal wetting layer and adsorb on the upper surface of the thin liquid metal wetting layer thus forming a surfactant monolayer of metal-nonmetal molecules which includes a specific orientation having a metallophobic side and a metallophilic side. When brought in close proximity to a seed crystal which is to be grown into a crystal, a physical mechanism enables the metal-nonmetal molecules of the surfactant monolayer to jump, tunnel or diffuse and couple with the seed crystal. A plurality of such jumps will form an epitaxial layer of the metal-nonmetal molecules on the seed crystal, thus increasing its volume and substantially growing a metal-nonmetal compound crystal on the seed crystal. Regulating the distance between the growing seed crystal and the upper level of the thin liquid metal wetting layer, with a continuous supply of metal-nonmetal molecules in the surfactant monolayer, will epitaxially grow the seed crystal into a metal-nonmetal compound crystal.

The disclosed technique relates to a general method for crystal growth and is limited to crystals grown from compound materials. In general, crystals grown using the disclosed technique are grown from a precursor compound that includes at least one metal and at least one nonmetal, herein abbreviated and referred to as an MN compound. In the description of the disclosed technique, the term 'metal' is used to denote any element in the periodic table of elements classified as either an alkali metal, an alkaline earth metal, a transition metal, a lanthanide element, an actinide element or an other metal. In the description of the disclosed technique, the term 'nonmetal' is used to denote any element in the periodic table of elements classified as a nonmetal or a halogen, such as hydrogen (H), carbon (C), nitrogen (N), oxygen (O), phosphorus (P), sulfur (S), selenium (Se), fluorine (F), chlorine (Cl), bromine (Br) and iodine (I). As is known to the worker skilled in the art, the following elements in the periodic table of elements are classified as metalloids: boron (B), silicon (Si), germanium (Ge), arsenic (As), antimony (Sb), tellurium (Te) and polonium (Po). Metalloids exhibit certain properties which are similar to both metals and nonmetals. As such, in the description of the disclosed technique, any element classified as a metalloid can be considered a metal or a nonmetal depending on which other element or elements it is bonded with. For example, in the compound germanium silicide (GeSi), Ge acts as a metal and Si acts as a nonmetal. However, in the compound silicon carbide (SiC), Si acts as a metal, with C being the nonmetal. Examples of MN compounds that can be used as a precursor compound include gallium nitride (GaN), aluminum oxide ($Al_2O_3$), cadmium zinc selenide (CdZnSe), indium gallium nitride (InGaN), Spinel ($MgAl_2O_4$), yttrium barium copper oxide ($YBa_2Cu_3O_7$) and the like.

Reference is now made to FIG. 1 which is a schematic illustration of a method for growing crystals of a metal-nonmetal compound from a surfactant, operative in accordance with an embodiment of the disclosed technique. In a procedure 100, a seed crystal is provided. The seed crystal represents the substrate upon which crystals of the MN compound of the disclosed technique will be grown upon. The seed crystal can have any kind of crystallographic structure and orientation and is not limited in any manner. Examples of different crystallographic structures are shown below in FIG. 4A-4C. In addition, the seed crystal can be used to grow homogeneous crystals, where the elements comprising the seed crystal and the elements comprising the MN compound are substantially similar. The seed crystal can also be used to grow heterogeneous crystals, where the elements comprising the seed crystal and the elements comprising the MN compound are substantially different. The seed can further be a small crystallite which may be one of many polycrystalline seeds grown on an amorphous or crystalline substrate. According to the disclosed technique, a variety of growth environments is possible and depends upon the specific MN compound crystal to be grown. Also, as described below the precursor materials required to grow the MN compound crystals according to the disclosed technique can be introduced in a selected growth environment using known crystal growth methods such as chemical vapor deposition (herein abbreviated CVD), molecular beam epitaxy (herein abbreviated MBE), liquid phase epitaxy (herein abbreviated LPE), vapor phase epitaxy (herein abbreviated VPE) and the like. Therefore, in procedure 100, the seed crystal which is provided is substantially placed in a suitable growth environment, depending on the specific MN compound crystal to be grown and the selected method for introducing the required precursor materials. As a first example, in procedure 100, the seed crystal may be provided and placed in a crucible for melting a metal, such as used in solution growth or LPE. As a second example, in procedure 100, the seed crystal may be provided and placed as a wafer in a high vacuum chamber, such as used in MBE. As a third example, the seed crystal may be provided as a polyseed layer deposited on a crystalline structure or on an amorphous structure.

In a procedure 102, atoms of a first metal are introduced in the vicinity of the seed crystal in order to form a thin liquid metal wetting layer on at least one surface of the seed crystal. In an alternative to procedure 102, atoms of a first metal are introduced to contact with the seed crystal in order to form a thin liquid metal wetting layer on at least one surface of the seed crystal. As mentioned above, the first metal may be similar to or different than a metal in the seed crystal. In addition, the first metal may be different than a metal in the seed crystal as well as a metal in the MN crystal to be grown. In this respect, the metal forming the thin liquid metal wetting layer may be different than both a metal in the seed crystal and a metal in a metal-nonmetal molecule used as a precursor material for growing an MN crystal according to the disclosed technique. In general, the first metal might have specific attributes such as a low melting temperature, a high evaporation temperature, being an inferior solvent of MN molecules which are to deposit on the seed crystal as an MN crystal. Examples of the first metal can include mercury (Hg), gallium (Ga), zinc (Zn), tin (Sn), magnesium (Mg) and the like. Any known method in the art may be used to introduce the atoms of the first metal in this procedure. For example, the first metal atoms can be introduced as a vapor which will eventually condense on at least one surface of the seed crystal, when the first metal atoms are placed as a solid in a Knudsen cell which is then heated to sublimate the first metal atoms as a vapor. The first metal atoms can also be introduced as a liquid metal (i.e., a metal melt) which surrounds the seed crystal on at least one of its surfaces. It is noted that the first metal atoms may be introduced in procedure 102 as a compound, including a metal element and a nonmetal element, in which the compound is dissociated in the vicinity of the seed crystal thus releasing the nonmetal atoms of the compound and condensing the first metal atoms as a liquid on the seed crystal. It is also noted that the seed crystal used in procedure 100 is selected such that the first metal atoms which are introduced in the vicinity of the seed crystal, which eventually form a thin liquid metal wetting layer on at least one surface of the seed crystal, can exist in a liquid state on a surface of the seed crystal without dissolving the seed crystal.

In a procedure 104, a temperature of the seed crystal is set below a minimal temperature required for dissolving metal-nonmetal molecules in the thin liquid metal wetting layer. This temperature can be referred to as a liquidus temperature. As mentioned above, the disclosed technique relates to growing MN compound crystals on a seed crystal. Depending on the selected metal-nonmetal compound to be grown as a crystal, the temperature of the seed crystal is set below the liquidus temperature yet also higher than the melting point of the first metal atoms which form the thin liquid metal wetting layer. It is noted in one embodiment of the disclosed technique that the metal-nonmetal molecules referred to above are to be formed from at least one of atom of the first metal and at least one atom of a first nonmetal. Therefore, the metal referred to in the metal-nonmetal molecules in this procedure and the metal which comprises the thin liquid metal wetting layer of procedure 102 are substantially the same. For example, if gallium nitride (herein abbreviated GaN) crystals are to be grown on the seed crystal in procedure 100, then in procedure 102, gallium (Ga) atoms are introduced in the vicinity of the seed crystal, or are introduced to contact with the seed crystal, thereby eventually forming a thin liquid gallium wetting layer on a surface of the seed crystal. In procedure 104, the temperature of the seed crystal is set below the liquidus temperature, which is this example would be below 1150° C. In general, it is known that MN compounds are not easily soluble in liquid melts of the metal that forms the MN compound, unless the MN compounds are subjected to very high temperatures and/or very high pressures, according to their respective phase diagrams.

According to another embodiment of the disclosed technique, the metal-nonmetal molecules referred to above are to be formed from at least one of atom of a second metal and at least one atom of a first nonmetal. Therefore, the metal referred to in the metal-nonmetal molecules in this procedure and the metal which comprises the thin liquid metal wetting layer of procedure 102 are substantially different. As noted above, the first metal and second metal mentioned in this embodiment may be different than the metal which constitutes the seed crystal. According to the previous embodiment, silicon carbide (herein abbreviated SiC) crystals, also known as carborundum, can be grown from a thin liquid silicon wetting layer in which the seed crystal temperature is to be set higher than 1400° C. According to this embodiment, SiC can be grown from a thin liquid tin wetting layer in which the seed crystal temperature is to be set at approximately 250° C. This embodiment can be used to grow many other types of crystals such as quartz, rutile ($TiO_2$) and the like.

In a procedure 106, molecules of a MN compound are introduced into the growth environment of the seed crystal. The MN compound may be introduced as molecules in which the metal and nonmetal are already bonded. This introduction can be executed by evaporating an MN compound, vaporizing an MN precursor or sputtering an MN compound target. The MN compound may also be introduced as separate metal and nonmetal particles (for example, as atoms, ions, radicals and the like) which combine in the growth environment to form MN molecules. In it noted that in this second type of introduction, the metal and nonmetal particles are to be co-deposited with the metal constituting the MN molecules being the same as the first metal introduced in procedure 102. For example, in an additional optional procedure occurring simultaneously as procedure 106 is executed, first nonmetal atoms may be vaporized in the growth environment of the seed crystal such that these first nonmetal atoms combine with the first metal atoms of procedure 106, thus forming MN molecules and an MN surfactant monolayer on a thin liquid metal wetting layer formed on the seed crystal. In general, a surfactant refers to a soap-like substance that decreases the surface tension of liquids, thereby spreading out the liquid and improving wetting. As the MN molecules impinge upon a given surface of the seed crystal, the MN molecules begin to form a thin metal-nonmetal surfactant monolayer on the surface of the thin liquid metal wetting layer. In general, the thin liquid metal wetting layer will form only if there are more metal atoms than nonmetal atoms introduced into the growth environment. If only MN molecules are introduced into the growth environment and provided to the seed, vapor solid crystal growth will occur on the seed crystal as known in the art. This MN layer is a monolayer in that it is substantially the thickness of one molecule of the MN compound. The MN monolayer also exhibits a two dimensional crystal-like structure in that the monolayer includes a repeating structure of the MN molecules which dwells on the upper surface of the thin liquid metal wetting layer and which is substantially flat on that upper surface. The molecules in this MN layer configure themselves to form a surfactant in which the metal atoms point in a direction facing the thin liquid metal wetting layer and the nonmetal atoms point in a direction facing away from the thin liquid metal wetting layer. This is shown in greater detail below in FIGS. 2A-2C where the MN surfactant monolayer is shown to include a metallophilic side, facing a thin liquid metal wetting layer and a metallophobic side, facing away from the thin liquid metal wetting layer.

The MN surfactant monolayer facilitates the formation of the thin liquid metal wetting layer which substantially forms between the MN surfactant monolayer and the given surface of the seed crystal. In this respect, the metal part of the MN surfactant faces into the thin liquid metal wetting layer while the nonmetal part of the MN surfactant faces out, away from the liquid metal wetting layer. As the temperature of the seed crystal is set such that the MN molecules introduced will not dissolve as whole molecules in the thin liquid metal wetting layer, the MN molecules introduced substantially adsorb on the upper surface of the thin liquid metal wetting layer as a surfactant monolayer. The MN surfactant monolayer substantially flattens the thin liquid metal wetting layer.

In a procedure 108, a thickness of the thin liquid metal wetting layer is regulated such that at least some of the MN molecules in the MN surfactant monolayer couple with the given surface of the seed crystal, thereby growing an epitaxial layer of a MN compound on the seed crystal. According to the disclosed technique, if the thin liquid metal wetting layer is substantially thin, for example, a few nanometers thick, then MN molecules in the MN surfactant monolayer can substantially 'jump,' 'tunnel' or 'diffuse' from the surfactant monolayer directly to the seed crystal and couple with the seed crystal, thus growing another monolayer of the MN compound on the seed crystal. In general, the particular thickness, or range of thicknesses required for a MN molecule in the surfactant monolayer to spontaneously join a crystal growing on the seed crystal is dependent on the metal and nonmetal selected as the MN compound, the choice of metal for the thin liquid metal wetting layer, the seed crystal temperature as well as the energy with which the metal and nonmetal precursor elements or compounds are introduced to the surfactant monolayer. As such, for each type of MN compound grown as a crystal on the seed crystal, a particular thickness or range of thicknesses needs to be regulated in this procedure to enable the MN molecules of the MN surfactant monolayer to act as a precursor material for growing the MN crystal on the seed crystal. If the thin liquid metal wetting layer becomes too thin, then the wetting layer will dry up and growth of the crystal epitaxially, layer by layer, will cease. If the thin liquid metal wetting layer becomes too thick, then MN molecules in the surfactant monolayer will not be able to spontaneously 'jump,' 'tunnel' or 'diffuse' to the growing crystal and crystal growth will cease entirely.

In procedure 108, the thickness of the thin liquid metal wetting layer can be regulated using various techniques depending on how the metal and nonmetal atoms which form, respectively, the thin liquid metal wetting layer and the MN surfactant monolayer are introduced into the growth environment. For example, if the MN molecules introduced in procedure 106 are introduced using evaporation crucibles then the flow of MN molecules can be regulated via an evaporation controller controlling the rate of evaporation of the metal. Evaporation controllers in such crystal growth environments can be embodied via an oscillating piezoelectric quartz crystal coupled with a proportional-integral-derivative (herein abbreviated PID) controller. If the MN molecules in procedure 106 are introduced as a plasma via at least one gas inlet, then the amount of plasma entering the growth environment can be regulated using a gas inlet manometer. A photo spectrometer can then be used to determine which plasma species are present in the growth environment as well as their relative density. Only certain plasma species will contribute to the MN surfactant monolayer.

According to another embodiment of the disclosed technique, regulation of the amount of plasma entering the growth environment can be executed without the use of a gas inlet manometer and/or a photo spectrometer. In this embodiment, a droplet criterion may be used as follows. In general, if the MN molecules are introduced in the growth environment as a plasma then a particular stoichiometric balance point needs to be achieved between the metal and nonmetal species being introduced in the growth environment. At this balance point, the ratio of metal to nonmetal species is such that the thin liquid metal wetting layer is of a thickness that enables molecules in the MN surfactant monolayer to couple with the crystal growing on the seed crystal. In general, during monolayer crystal growth, droplets of a particular precursor material may form on the surface of the growing crystal. Using the example of growing GaN crystals, Ga may be evaporated as a gas at a steady rate with nitrogen plasma being introduced in the growth environment using a plasmatron operating at high power. Reflection high-energy electron diffraction (herein abbreviated RHEED) techniques can then be used to detect an amorphous or polycrystalline material growing on the surface of the seed crystal, which will appear on a RHEED monitor as high intensity spots. As the power of the plasmatron is lowered, images on the RHEED monitor will get darker as fewer spots are registered. Eventually, no spots will be registered and at such a plasmatron power level, Ga droplets will start to form on the surface of the seed crystal. By using trial and error, the plasmatron power level can be further lowered and modified such that no droplets form on the surface of the seed crystal. When no droplets form on the surface of the seed crystal, the above mentioned balance point is achieved such that the thin liquid metal wetting layer begins to form on the surface of the seed crystal. Other trial and error methods are possible for determining the proper amount of metal and nonmetal particles for achieving the thin liquid metal wetting layer and MN surfactant monolayer.

Referring back to procedure 104, the exact temperature which the seed crystal is set at depends on a number of factors which can be determined by trial and error and according to the metal and nonmetal atoms which are selected to form the MN compound. For example, the temperature of the seed crystal needs to be higher than the melting point of the at least one metal which is introduced in the MN compound. It is noted that this temperature will depend on whether the metal introduced is introduced as a pure metal or as a mixture of metals, since mixtures of metals may have a eutectic melting point which is lower than the melting points of the individual metals constituting the mixture. Higher temperatures above the melting point of the metal may increase the deposition rate of the atoms of the metal on the surface of the MN surfactant monolayer, thus increasing the deposition rate or 'tunneling rate' of molecules from the surfactant monolayer to the growing crystal on the seed crystal. Even higher temperatures (although lower than the minimal temperature described in procedure 104) may increase the tunneling rate to such a rate that regulation of the stoichiometric balance point of the metal and nonmetal particles forming the MN compound may be of concern. In addition, at such higher temperatures, MN molecules forming the surfactant monolayer may re-evaporate and MN molecules of the grown crystal may dissociate from the current growing layer of the crystal. Using trial and error, as is known to the worker skilled in the art, an optimal temperature for the seed crystal can be determined wherein the incorporation rate of the MN molecules is maximized yet the stoichiometric balance point of the metal and nonmetal precursor materials can be regulated. It is also noted that trial and error may need to be used by a worker skilled in the art to determine the rate at which the first metal atoms and first nonmetal atoms are introduced into the growth environment (as per procedures 102 and 106 above) since a high rate of introduction may increase the rate at which epitaxial growth occurs on the seed crystal. At the same time however, too high a rate of introduction may make it difficult to maintain the stoichiometric balance point between the metal and nonmetal precursor materials.

It is noted that the method described in FIG. 1 is substantially different than other prior art methods of crystal growth from a solution in that the temperatures at which crystal growth is possible is significantly lower. For example, prior art methods for growing GaN crystals from a solution usually require temperatures as high as 1400° C. and a pressure of 15000 bars, wherein according to the disclosed technique, GaN crystals can be grown at temperatures as low as 35° C. and at vacuum conditions. Prior art methods of growing Spinel use temperatures as high as 2140° C., whereas according to the disclosed technique, Spinel can be grown at temperatures as low as 450° C. Growth of crystals at lower temperatures can significantly increase the quality of the grown crystals as thermal dislocations can occur when a crystal grown at high temperatures is cooled to a useable temperature, such as room temperature. By reducing the temperature difference between the growth temperature and the useable temperature according to the disclosed technique, thermal dislocations can be significantly reduced.

After procedure 108, an additional procedure can be executed in which the first metal atoms of procedure 102 are no longer supplied to the growth environment. As a result of the cessation of first metal atoms in the growth environment, the thin liquid metal wetting layer formed in procedure 106 will dry up and the layer by layer epitaxial growth of the MN compound crystal on the seed crystal in procedure 108 will cease. Since the temperature of the seed crystal will still be below a temperature at which MN molecules can dissolve in a thin liquid metal wetting layer, any crystal growth of the metal-nonmetal compound on the seed crystal will occur according to a vapor solid growth technique at low temperatures, as is known in the art. Vapor solid growth of crystals on the seed crystal will change the upper surface of the epitaxially grown MN compound crystals, which exhibit a flat monocrystalline structure into crystals exhibiting a polycrystalline structure. The polycrystalline structure can substantially be considered a new seed crystal upon which the crystal growth technique of FIG. 1 can now be repeated. Therefore, after this additional procedure, the method of FIG. 1 can return to procedure 102 and epitaxial layer by layer growth of a MN compound crystal can resume again. It is noted that in this manner different layers of MN compound crystals can be grown, where each layer is constituted by a different metal and/or nonmetal. It is also noted that if the original seed crystal of procedure 100 had a pyramidal geometry, such that nanocolumns were grown from the seed crystal, as shown below in FIG. 4C, then when the polycrystalline structure is formed in this additional procedure, the polycrystalline structure may also exhibit a pyramidal geometry upon which additional nanocolumns can be grown epitaxially according to the method of FIG. 1. It is noted that when the thin liquid metal wetting layer is dried, the temperature of the seed crystal as well as the rate of deposition of any metal and/or nonmetal particles in the growth environment can be modified to grow a particular type of polycrystalline crystal layer which buffers between adjacent monocrystalline layers of epitaxial crystal growth. For example, before a new thin liquid metal wetting layer is formed, a deposition rate of a metal and/or nonmetal may be significantly increased in order to grow a flat and thick polycrystalline crystal layer.

After procedure 108, a further procedure can be executed, either after the aforementioned additional procedure or as an alternative to the aforementioned additional procedure. In this further procedure, instead of ceasing the supply of first metal atoms to the growth environment and thereby drying up the thin liquid metal wetting layer, the supply of the first nonmetal particles can be gradually slowed to substantially nil, thus leaving a thin layer of the first metal atoms on the surface of the grown crystal. This thin layer can then be evaporated by heating the seed crystal or can be etched away using known wet chemistry or plasma chemistry techniques. Removing this thin layer will result in a clean upper surface of the grown crystal upon which other processes can be performed. If the method of FIG. 1 is used to grow a crystal having a Manhattan structure or a crystal in the form of nanocolumns (respectively shown below in FIGS. 4B and 4C), then after this further procedure, the upper surface of the grown crystals or nanocolumns can be cleaned by the techniques listed above, thus leaving clean upper surfaces of the grown crystals and/or nanocolumns. Any residue metal left between the grown crystals and/or nanocolumns can also be removed by evaporation or via etching using known wet chemistry or plasma chemistry techniques.

Figure 2A:
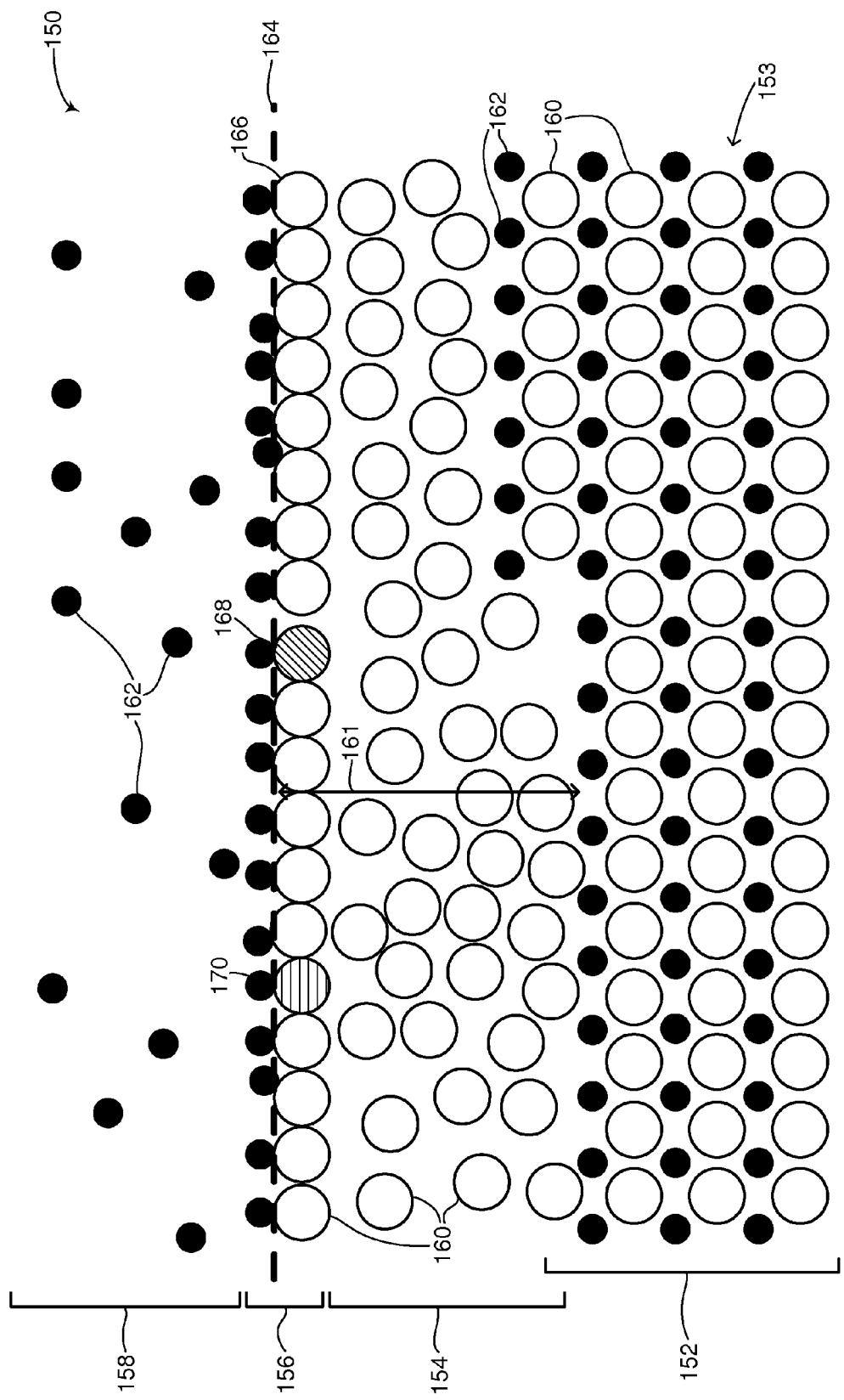
FIG. 2A is a first schematic illustration of the atomic structure of a metal-nonmetal compound crystal grown using the method of FIG. 1, constructed and operative in accordance with another embodiment of the disclosed technique.
Figure 2B:
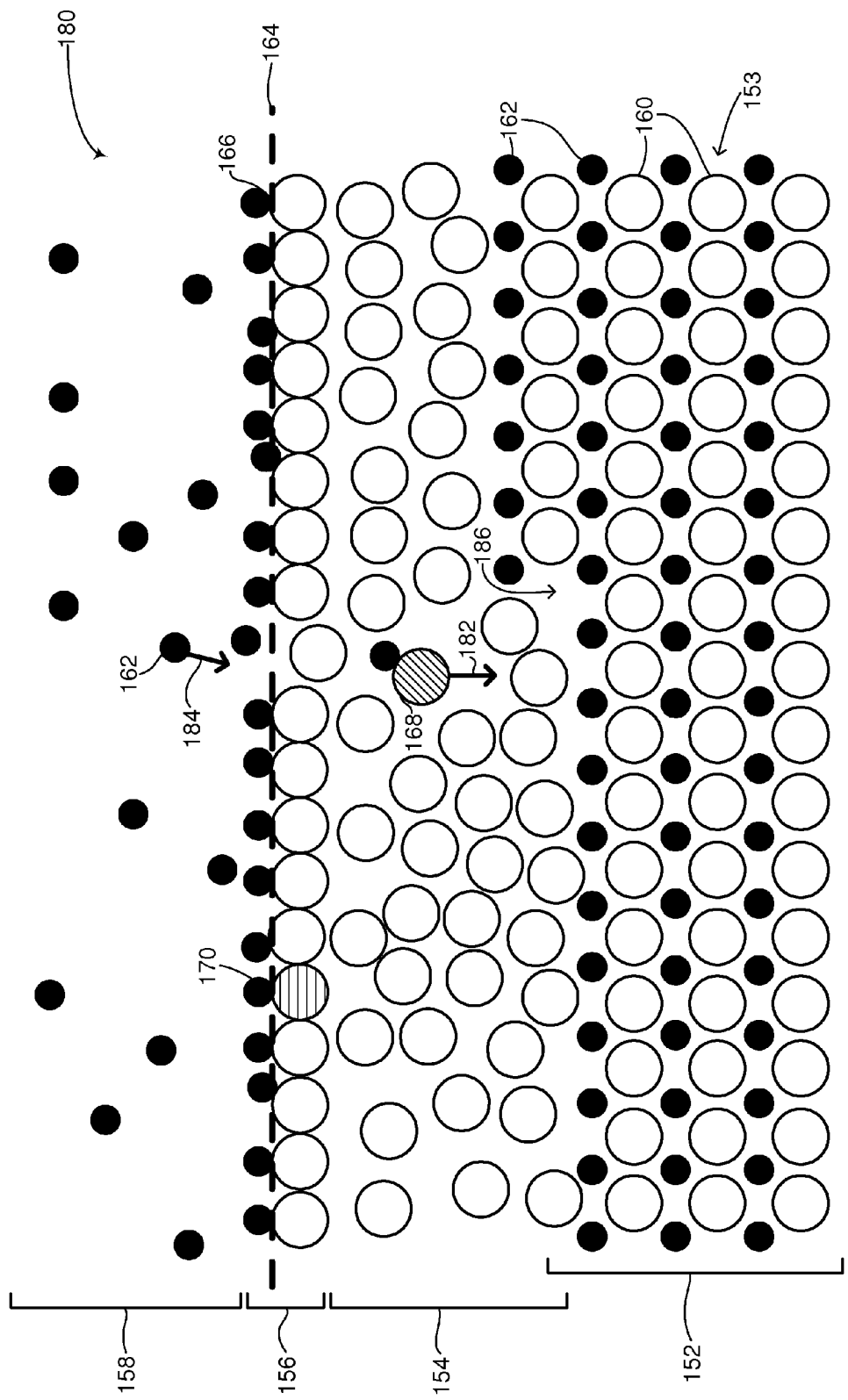
FIG. 2B is a second schematic illustration of the atomic structure of a metal-nonmetal compound crystal grown using the method of FIG. 1, constructed and operative in accordance with a further embodiment of the disclosed technique.
Figure 2C:
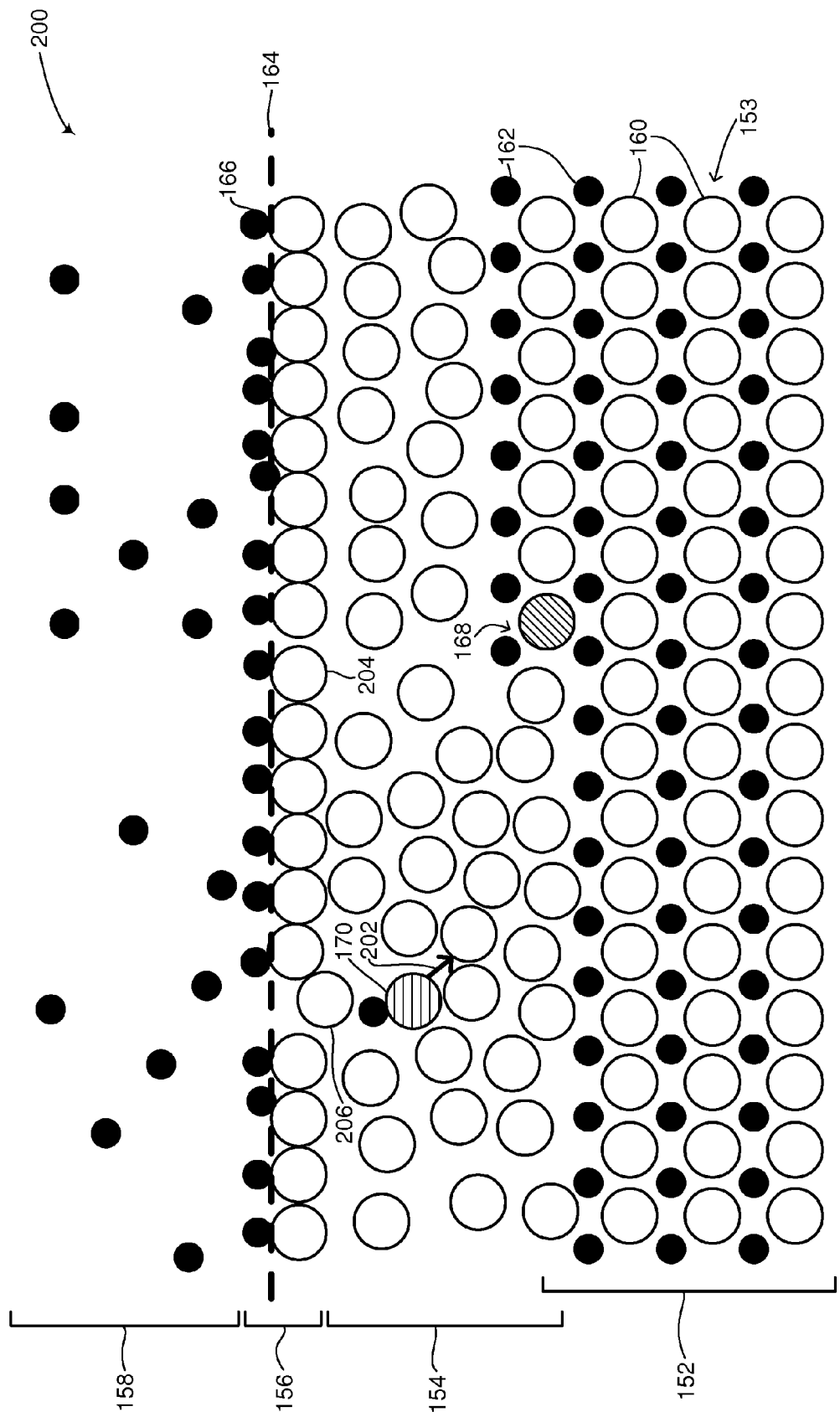
FIG. 2C is a third schematic illustration of the atomic structure of a metal-nonmetal compound crystal grown using the method of FIG. 1, constructed and operative in accordance with another embodiment of the disclosed technique.

Reference is now made to FIG. 2A which is a first schematic illustration of the atomic structure of a metal-nonmetal compound crystal grown using the method of FIG. 1, generally referenced 150, constructed and operative in accordance with another embodiment of the disclosed technique. FIG. 2A includes a solid phase 152, a thin liquid metal wetting layer 154, an MN surfactant monolayer 156 and a gas phase 158. In general, FIGS. 2A-2C show an atomic structure after procedures 100-106 (FIG. 1) have been executed, i.e., after a thin liquid metal wetting layer and a MN surfactant monolayer have been formed on top of a seed crystal. The seed crystal may be solid phase 152 or a lower portion of solid phase 152. Solid phase 152 represents a growing crystal 153. In this schematic illustration, a GaN crystal is shown which includes a plurality of Ga atoms 160 and a plurality of N atoms 162. Whereas GaN was selected as an example to illustrate the disclosed technique due to its relatively simple structure and thus simplicity in graphic format, the general atomic structure described in FIGS. 2A-2C applies to any MN compound grown as a crystal using the method shown in FIG. 1. As shown in growing crystal 153, plurality of Ga atoms 160 and plurality of N atoms 162 are arranged in a crystallographic structure. Lower layers (not shown) of growing crystal 153 may represent a seed crystal (not shown) upon which growing crystal 153 was grown. As mentioned above, the seed crystal may be homogeneous or heterogeneous with growing crystal 153. For example, the seed crystal may be a GaN seed, a sapphire seed or a silicon seed. In addition, if growing crystal 153 was sapphire, then the seed crystal may be a sapphire seed or a silicon seed. In the case that the seed crystal and growing crystal 153 are heterogeneous, then the number of misfit dislocations due to differences in the respective crystallographic structures of the seed crystal and the growing crystal is substantially the reciprocal of the dimension of the seed crystal exposed to growth. Therefore, a smaller dimension of seed crystal exposed to growth will result in fewer misfit dislocations on the growing crystal when the two are heterogeneous.

As described below in FIGS. 4A-4C, the seed crystal (not shown) can have any suitable geometric structure that enables epitaxial crystal growth. For example, the seed crystal may have a flat geometry in which traditional, layer by layer epitaxy can occur, as shown here in FIG. 2A-2C and below in FIG. 4A. As another example, the seed crystal may have a pyramidal geometry, as shown below in FIG. 4C, from which nanocolumns of crystals can be grown. The seed crystal can also be a nanometer sized crystalline seed or a bulky millimeter sized traditional seed. The seed crystal can further be a wafer with at least one flat surface or the tip of a crystalline fiber. It is also noted that seed crystal can be coupled with a crystalline material (not shown) or an amorphous material (not shown). One requirement of the seed crystal is that it does not dissolve or melt in thin liquid metal wetting layer 154 or a metal melt (not shown) which may surround solid phase 152. Also, any crystallographic orientation of the seed crystal can be selected for the growth of growing crystal 153 provided that the selected orientation is parallel to the direction of thin liquid metal wetting layer 154.

As described in greater detail below in FIGS. 3A and 3B, thin liquid metal wetting layer 154 represents the metal which is part of the MN crystal on the seed crystal. As shown in FIG. 2A, thin liquid metal wetting layer 154 includes a plurality of Ga atoms 160, although the Ga atoms in thin liquid metal wetting layer 154 do not form a part of solid phase 152. As described below in FIG. 3A, thin liquid metal wetting layer 154 can actually be a portion of a metal solution (not shown) surrounding the seed crystal. The metal solution may be a mixture of metals. In such a case, the ratio of the constituents of the metal solution should correspond to the molar ratio of the metal mixture to enable crystal growth. For example, if the metal solution is a Spinel solution which only includes the metal part of Spinel (i.e., Spinel has a chemical formula of $MgAl_2O_4$, where $MgAl_2$ represents the metal part of Spinel) then the solution should have a molar ratio of 1 magnesium (Mg) atom to 2 aluminum (Al) atoms as per the chemical formula for Spinel. This example shows the difference in required temperature for crystal growth of the disclosed technique as compared with the prior art. Using a pure Spinel solution of $MgAl_2O_4$ to grow crystals would require creating a Spinel melt. The melting point of Spinel is 2135° C., thus requiring a high temperature to create a Spinel melt and making crystal growth in such a high temperature environment difficult. A metal mixture of magnesium and aluminum has a eutectic melting point of 425° C., thereby enabling significantly lower temperatures to be used to create the metal solution of the disclosed technique. In addition, the temperature of the growth environment also dictates the type of crucible material used, if crucibles are used, as well as the type of heater used to generate the metal solution. Lower temperatures enable a wider variety of crucible materials and heaters to be used as well as being more cost effective.

In general, as described above in FIG. 1, thin liquid metal wetting layer 154 can be deposited on growing crystal 153 using a variety of known techniques, such as vapor evaporation, MBE, CVD, VPE and the like. Sputtering techniques can also be used to deposit thin liquid metal wetting layer 154 on growing crystal 153 although in such techniques, care needs to be taken regarding the purity of the thin liquid metal wetting layer as well as its rate of deposition on growing crystal 153. As shown below in FIGS. 3A and 3B, the thin liquid metal wetting layer may be a portion of a metal melt or a thin film formed on a seed crystal or on a growing crystal. Unlike prior art crystal growth methods, there is no requirement to dip the seed crystal, which may be a wafer, in a metal melt, although according to some embodiments of the disclosed technique, the seed crystal may be placed in a metal melt. In general, when atoms and particles are supplied to the growth environment of growing crystal 153, the metal and nonmetal atoms and particles which are precursors for growing crystal 153 are to be co-deposited, i.e., are to be introduced into the growth environment simultaneously. This co-deposition enables epitaxial growth of growing crystal 153. Although not explicitly shown in FIG. 2A, according to the disclosed technique, different mixtures of metals may be introduced into the growth environment over time, each mixture being deposited at its own respective rate, to create a growing crystal having different layers of constituents.

As described below in FIGS. 3A and 3B, growing crystal 153 may be grown using a system used for bulk crystal growth or using a system for thin film epitaxial crystal growth. In either case, the nonmetal constituent of growing crystal 153 comes from a gas as shown in gas phase 158. As shown in FIG. 2A, gas phase 158 includes plurality of N atoms 162. The N atoms in gas phase 158 may actually be various species of N particles, such as ions or radicals, depending on how the N atoms are introduced into the growth environment. The nonmetal particles of gas phase 158 may be supplied to the growth environment using a variety of systems that depend on the particular nonmetal being introduced. The nonmetal particles may either be introduced in a pure form or as part of a mixture or compound which dissociates in the growth environment. For example, if oxygen is to be introduced in gas phase 158, then oxygen may be provided from an oxygen gas container. If boron is to be introduced in gas phase 158, then decaborane may be provided which is either activated by a plasma or cracked when it impinges on MN surfactant monolayer 156. If carbon is to be introduced in gas phase 158, then suitable hydrocarbons, such as methane may be provided which is either activated by a plasma or cracked when it impinges on MN surfactant monolayer 156. Silane ($SiH_4$) might be used as a precursor material for introducing silicon in gas phase 158, while nonmetal elements of groups V and VI having low melting points, such as P, As, Sb, S, Se and Te may be introduced into the growth environment in gas phase 158 by being evaporated from crucibles. Nitrogen may be introduced in gas phase 158 from a nitrogen gas container or as ammonia. Nitrogen may also be introduced as nitrogen plasma or as cracked ammonia. In general, if the nonmetal particles are introduced into gas phase 158 as a gas compound having a relatively high temperature of dissociation, such as ammonia gas which dissociates at around 750° C., then a radio frequency (herein abbreviated RF) plasma or an electron cyclotron resonance (herein abbreviated ECR) plasma can be used to supply the active nonmetal particles. In other circumstances, the temperature of thin liquid metal wetting layer 154 may be high enough to dissociate any gas compound in gas phase 158. It is also noted as shown in FIG. 2A, as well as in FIGS. 2B and 2C, that according to the disclosed technique, growing crystal 153 is grown in a growth environment which can be considered to be 'metal-rich,' i.e., thin liquid metal wetting layer 154 includes more metal particles than the nonmetal particles in gas phase 158.

As shown in FIG. 2A, MN surfactant monolayer 156 forms the upper part of thin liquid metal wetting layer 154 and represents an interface between gas phase 158 and thin liquid metal wetting layer 154. MN surfactant monolayer 156 includes a plurality of MN molecules which forms a two dimensional liquid crystal above the surface of thin liquid metal wetting layer 154. As shown in the example of FIG. 2A, MN surfactant monolayer 156 includes a plurality of GaN molecules 166, including a first GaN molecule 168 and a second GaN molecule 170 which are singled out for illustrative purposes in FIGS. 2A-2C. As shown by a dotted line 164, plurality of GaN molecules 166 substantially flatten the upper surface of thin liquid metal wetting layer 154 and are organized as a self-assembled two dimensional lattice. This lattice includes only one layer of molecules, hence it is considered a monolayer. In addition, plurality of GaN molecules 166 can 'float around' or 'wander about' MN surfactant monolayer 156, in a similar fashion to a liquid crystal. As shown in FIG. 2A, the N atoms constituting plurality of GaN molecules 166 face gas phase 158 whereas the Ga atoms constituting plurality of GaN molecules 166 face thin liquid metal wetting layer 154. In this respect, as mentioned above, plurality of GaN molecules 166 form a surfactant since their metallophilic side, i.e., the Ga atoms, face thin liquid metal wetting layer 154 and their metallophobic side, i.e., the N atoms, face gas phase 158.

In general, MN surfactant monolayer 156 serves two separate functions. As an active surface agent, MN surfactant monolayer 156 lowers the surface tension of thin liquid metal wetting layer 154, thus flattening it to resemble a 'sea' as shown in FIG. 2A and enabling epitaxial growth, as shown below in FIGS. 2B and 2C. In addition, as shown below, MN surfactant monolayer 156 acts as the precursor material for nourishing the growth of growing crystal 153. As mentioned above, according to the disclosed technique, the distance between MN surfactant monolayer 156 and growing crystal 153, as shown by a double headed arrow 161, must be regulated and maintained in order to enable GaN molecules in MN surfactant monolayer 156 to jump, tunnel or diffuse to growing crystal 153. In addition, the thickness of MN surfactant monolayer 156 must also be regulated and maintained such that no more than two or three monolayers (not shown) form above the surface of thin liquid metal wetting layer 154. In general, the aforementioned regulations are dependent on a proper balance between the metal and nonmetal constituents introduced into the growth environment shown in FIG. 2A.

Reference is now made to FIG. 2B which is a second schematic illustration of the atomic structure of a metal-nonmetal compound crystal grown using the method of FIG. 1, generally referenced 180, constructed and operative in accordance with a further embodiment of the disclosed technique. Similar elements in FIGS. 2A and 2B are labeled using identical numbering. FIG. 2B shows how first GaN molecule 168 jumps or tunnels from MN surfactant monolayer 156 to solid phase 152. In general, the temperature of growing crystal 153 is set below a temperature in which thin liquid metal wetting layer 154 can dissolve plurality of GaN molecules 166. Therefore, according to the phase diagram (not shown) of a Ga metal melt (i.e., thin liquid metal wetting layer 154) and GaN molecules (i.e., plurality of GaN molecules 166), GaN molecules are thermodynamically not allowed to be present in thin liquid metal wetting layer 154. However, according to the disclosed technique, if thin liquid metal wetting layer 154 is of a suitable thickness, such as between one to three nanometers, then first GaN molecule 168 can jump, tunnel or diffuse from MN surfactant monolayer 156 to solid phase 152, as shown by an arrow 182, in a similar manner to the tunneling of electrons as is known in the theory of quantum physics. First GaN molecule 168 may be prompted to jump or tunnel due to kinetic energy it receives from one of plurality of N atoms 162, as shown by an arrow 184. As the particles in gas phase 158 may have a high level of kinetic energy, the bouncing and hitting of those particles on MN surfactant monolayer 156 may cause individual GaN molecules to jump or tunnel to solid phase 152. As growing crystal 153 is grown epitaxially, growing crystal 153 may exhibit a stepped structure such as shown by a terrace 186 in growing crystal 153. In general, terraces represent energy-favorable locations in a growing crystal such that first GaN molecule 168 will be attracted to couple with solid phase 152 specifically at terrace 186.

Reference is now made to FIG. 2C which is a third schematic illustration of the atomic structure of a metal-nonmetal compound crystal grown using the method of FIG. 1, generally referenced 200, constructed and operative in accordance with another embodiment of the disclosed technique. Similar elements in FIGS. 2A, 2B and 2C are labeled using identical numbering. In FIG. 2C, first GaN molecule 168 has coupled with solid phase 152 and joined growing crystal 153. As shown in FIG. 2C, first GaN molecule 168 now has a crystallographic configuration to match the crystallographic structure of growing crystal 153. Also shown in FIG. 2C, another GaN molecule 204 has been formed at MN surfactant monolayer 156 and has taken the place of where first GaN molecule 168 was in FIG. 2A. In addition, second GaN molecule 170 has begun to jump and tunnel towards solid phase 152, as shown by an arrow 202. Also, another Ga atom 206 is shown making its way to MN surfactant monolayer 156 where it can couple with an N atom and form a further GaN molecule to replace second GaN molecule in MN surfactant monolayer 156. Second GaN molecule 170 will be attracted to first GaN molecule 168 in growing crystal 153, as first GaN molecule is now situated at a terrace (not labeled) in growing crystal 153. In general, once procedures 100-106 (FIG. 1) are executed, procedure 108 (FIG. 1) is executed indefinitely to continuously grow layer upon layer of a crystal. As shown in FIGS. 2A-2C, metal particles in thin liquid metal wetting layer 154 couple with nonmetal particles in gas phase 158 to form MN molecules in MN surfactant monolayer 156. The MN molecules in MN surfactant monolayer 156 then jump, tunnel or diffuse to solid phase 152, thus causing the growth of growing crystal 153 epitaxially as precursor materials. Metal and nonmetal particles then continue to combine into MN molecules in MN surfactant monolayer 156 as growing crystal 153 continues to grow.

With reference back to FIG. 2A, MN surfactant monolayer 156 and thin liquid metal wetting layer 154 must both be regulated and maintained as thin layers to enable growth of the growing crystal 153 according to the disclosed technique. Thin liquid metal wetting layer 154 should not have a thickness greater than three nanometers and MN surfactant monolayer 156 should include not more than two to three monolayers, each having a thickness of approximately 0.3 nanometers. In general, the closer MN surfactant monolayer 156 is to growing crystal 153, the easier it should be for plurality of GaN molecules 166 to tunnel to growing crystal 153 and the frequency at which GaN molecules jump and couple with solid phase 152 should increase. As the distance between the upper layer (not labeled) of solid phase 152 and MN surfactant monolayer 156 increases, fewer GaN molecules will tunnel to solid phase 152. In addition, particles in gas phase 158 may combine with particles in thin liquid metal wetting layer 154 to form additional layers of metal-nonmetal molecules on MN surfactant monolayer 156. For example, the thickness of MN surfactant monolayer 156 may increase to two or three monolayers (not shown in FIGS. 2A-2C) in this manner in which case it would be a MN surfactant layer. It is assumed that at such a thickness of two or three monolayers, the surfactant layer will still be elastic enough to form a stable two dimensional liquid crystal and that molecules in the surfactant layer can still tunnel to solid phase 152.

However, if the thickness of the surfactant layer were to further increase, such as being four monolayers or greater, then the surfactant layer may become unstable with crystallization spots appearing along the surfactant layer. Such crystallization spots may appear in order to relieve any stresses in the surfactant layer caused by uncommon angles formed between molecules in the surfactant layer. These crystallization spots may be relatively short in distance and may form non-right angles between adjacent atoms and molecules in the surfactant layer. This in turn may lead to an increase in density of atoms and molecules in selected portions of the surfactant layer which may lead to avalanche crystallization. The surfactant layer may then get stiffer, flaws may appear in its structure and it may ultimately break. A polycrystalline layer embedded with droplets may then appear at the level of the surfactant layer which may cease epitaxial growth of growing crystal 153. Related consequences are assumed as well regarding the thickness of thin liquid metal wetting layer 154. If thin liquid metal wetting layer 154 becomes too thick, since too many metal particles were introduced into the growth environment, then epitaxial growth of growing crystal 153 from molecules in the surfactant layer may cease and the surfactant layer may turn into a polycrystalline layer as mentioned above. In addition, if thin liquid metal wetting layer 154 becomes too thin, epitaxial growth of growing crystal 153 may cease due to a drying of thin liquid metal wetting layer 154. As mentioned above, the thicknesses of both thin liquid metal wetting layer 154 and MN surfactant monolayer 156 need to be regulated to ensure that epitaxial growth of growing crystal 153 from molecules in the surfactant layer continues.

It is also noted that MN surfactant monolayer 156 may serve an additional function of preventing the formation of droplets on growing crystal 153. In prior art crystal growing methods where crystals are grown using vapor-solid growth techniques, metal vapor deposited on a wafer or substrate causes the formation of droplets on the wafer or substrate surface which can lead to defects in the grown crystal. According to the disclosed technique, MN surfactant monolayer 156 substantially forms as thin liquid metal wetting layer 154 is formed. MN surfactant monolayer 156 acts as an active surface agent which neutralizes the surface energy of thin liquid metal wetting layer 154 and thus prevents the formation of droplets. This is due to the amphiphilic nature of the molecules forming MN surfactant monolayer 156. Unlike prior art methods of thin film epitaxy where droplets are expected during the growth process and steps need to then be taken once droplets form in order to eliminate them, according to the disclosed technique the formation of droplets is avoided due to the presence of the MN surfactant layer. The metal and nonmetal particles substantially form the molecules of the surfactant layer which substantially prevents the formation of droplets.

Regarding gas phase 158, it is noted that a mixture of gases may be supplied to gas phase 158 thus forming different constituents and precursor materials in MN surfactant layer 156 for growing crystal 153. Thus different materials may constitute the various layers of growing crystal 153. It is understood however by the worker skilled in the art that different mixtures of gases will have different levels of efficiency in incorporating MN molecules, formed from the mixtures of gases, into growing crystal 153. Different mixtures of gases may also affect the ease at which MN molecules can jump and tunnel into solid phase 152.

Figure 2D:
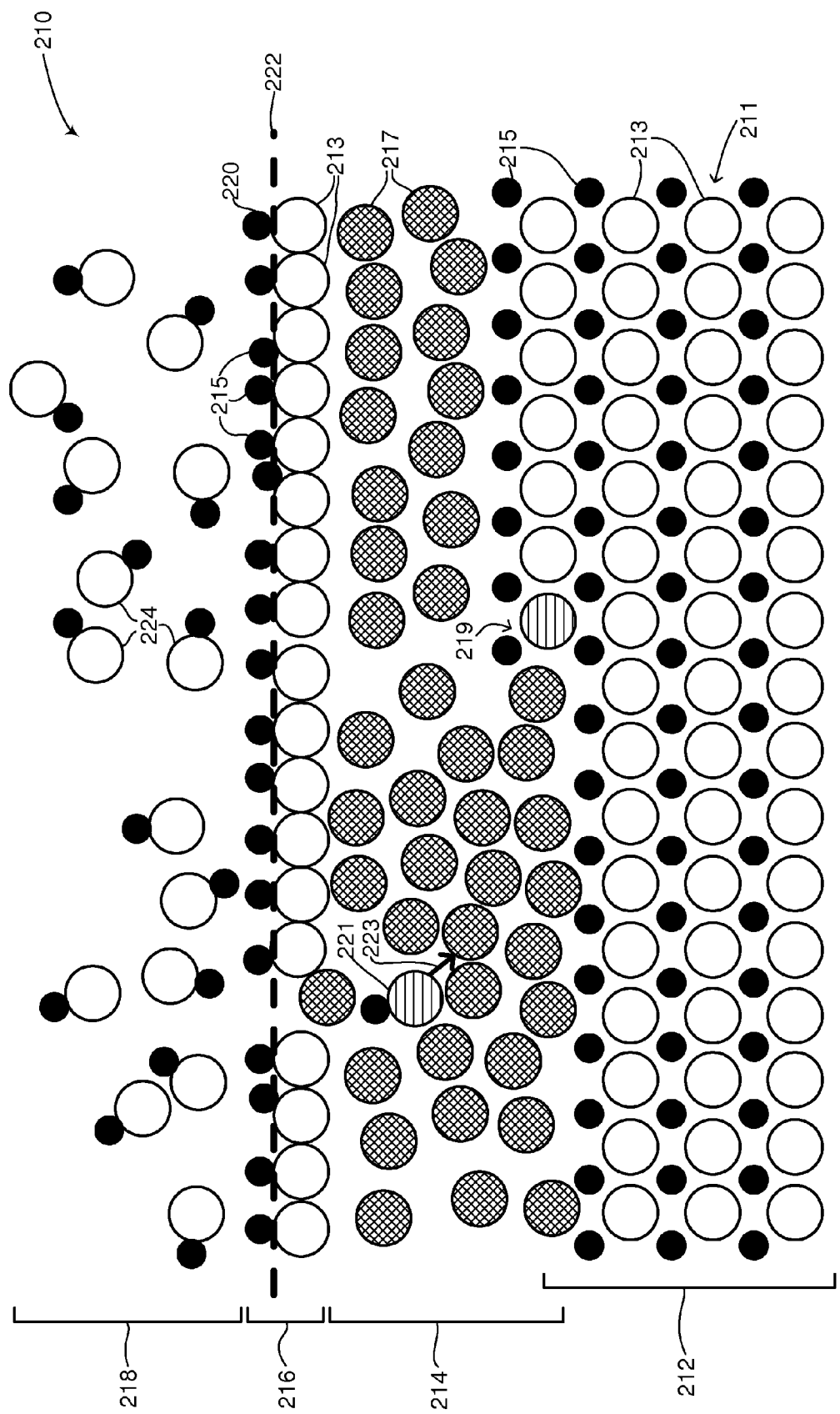
FIG. 2D is a fourth schematic illustration of the atomic structure of a metal-nonmetal compound crystal grown using the method of FIG. 1, constructed and operative in accordance with a further embodiment of the disclosed technique.

Reference is now made to FIG. 2D which is a fourth schematic illustration of the atomic structure of a metal-nonmetal compound crystal grown using the method of FIG. 1, generally referenced 210, constructed and operative in accordance with a further embodiment of the disclosed technique. FIG. 2D includes a solid phase 212, a thin liquid metal wetting layer 214, an MN surfactant monolayer 216 and a gas phase 218. FIG. 2D shows an atomic structure after procedures 100-106 (FIG. 1) have been executed, i.e., after a thin liquid metal wetting layer and a MN surfactant monolayer have been formed on top of a seed crystal in which the metal constituting the thin liquid metal wetting layer is different than the metal in the MN surfactant monolayer. Solid phase 212 represents a growing crystal 211. In this schematic illustration, a SiC (silicon carbide) crystal is shown which includes a plurality of Si (silicon) atoms 213 and a plurality of C (carbon) atoms 215. As shown in growing crystal 211, plurality of Si atoms 213 and plurality of C atoms 215 are arranged in a crystallographic structure. As shown, thin liquid metal wetting layer 214 includes a plurality of Sn (tin) atoms 217. MN surfactant monolayer 216 includes a plurality of SiC molecules 220 arranged in a two dimensional crystallographic orientation as a surfactant, as shown by a line 222. Gas phase 218 includes a plurality of SiC molecules 224.

The atomic structure shown in FIG. 2D can be prepared as follows. Solid phase 212 may be a SiC wafer seed. The SiC wafer seed is introduced into a radio frequency (herein abbreviated RF) sputtering reactor (not shown). An argon plasma (not shown) is then used to clean the upper surface (not labeled) of the SiC wafer seed while the temperature of the SiC wafer seed is raised to 250° C. It is noted that this temperature is above the melting point of Sn yet below the liquidus temperature of SiC such that SiC molecules will not dissolve in the tin wetting layer. By biasing the SiC sputtering target with RF waves, argon atoms will sputter SiC molecules off the SiC sputtering target, shown as plurality of SiC molecules 224. Simultaneously, a tin effusion cell (not shown), coupled with the RF sputtering reactor, is opened such that tin vapor (not shown) is emitted for long enough, for example for a minute, such that thin liquid metal wetting layer 214 forms on the surface of solid phase 212. Thin liquid metal wetting layer 214 may have a thickness of approximately one nanometer. As mentioned above, the wetting layer is a thin liquid tin wetting layer. A portion of plurality of SiC molecules 224 adsorb on the upper surface of thin liquid metal wetting layer 214, thereby flattening plurality of Sn atoms 217 and forming MN surfactant monolayer 216, shown as plurality of SiC molecules 220. As shown in FIG. 2D, each one of plurality of SiC molecules 220 has its metallophilic side, constituting plurality of Si atoms 213, facing plurality of Sn atoms 217, and its metallophobic side, constituting plurality of C atoms 215, facing gas phase 218.

Without changing the sputtering conditions of the RF sputtering reactor, SiC molecules in gas phase 218 will knock and impinge upon plurality of SiC molecules 220 which are part of MN surfactant monolayer 216. SiC molecules in MN surfactant monolayer 216 which are knocked into thin liquid metal wetting layer 214 may jump, tunnel or diffuse to solid phase 212, thus joining growing crystal 211, such as a SiC molecule 219, which has already joined growing crystal 211, or a SiC molecule 221, which is en route to joining growing crystal 211, as shown by an arrow 223. Once a SiC molecule leaves MN surfactant monolayer 216, a SiC molecule in gas phase 218 may take its place in MN surfactant monolayer 216.

Reference is now made to FIG. 3A which is a schematic illustration of a system for growing a metal-nonmetal compound crystal using the method of FIG. 1, generally referenced 230, constructed and operative in accordance with another embodiment of the disclosed technique. System 230 includes a growth chamber 232, a pedestal 234 and a motor 236. Motor 236 is coupled with pedestal 234. Growth chamber 232 may be a crucible. Motor 236 can lower and raise pedestal 234 in growth chamber 232, for example as shown by an arrow 248, motor 236 can lower pedestal 234. Motor 236 can also rotate pedestal 234 (not shown in FIG. 3A). System 230 represents a system for growing bulk crystals from a bulk liquid metal. A seed crystal 238 is placed on pedestal 234. Seed crystal 238 may be itself be placed on a substrate (not shown) which is placed on pedestal 234. Seed crystal 238 is placed on pedestal 234 such that a surface 250 upon which crystals are to be grown is facing an opposite direction of pedestal 234. Growth chamber 232 is filled with a metal melt 240 such that metal melt 240 covers surface 250. Many known techniques can be used for filling growth chamber 232 with metal melt 240 and for continuously supplying metal melt 240 to growth chamber 232. It is noted that if growth chamber 232 is embodied as a crucible then the material of growth chamber 232 needs to be properly selected to contain metal melt 240 such that metal melt 240 will not dissolve the crucible at the melting temperature of metal melt 240.

A nonmetal gas 242 is then provided to growth chamber 232 above the surface of metal melt 240. Particles of nonmetal gas 242 and metal melt 240 will interact thereby forming a metal-nonmetal surfactant monolayer 246 above surface 250 of seed crystal 238. MN surfactant monolayer 246 substantially flattens the upper layer of metal melt 240. As shown in FIG. 3A, the distance between surface 250 and MN surfactant monolayer 246, shown as a line 244, is regulated to be within a few nanometers such that MN molecules in MN surfactant monolayer 246 jump and tunnel to surface 250 and begin forming a crystal on seed crystal 238. The distance as shown by line 244 can be regulated by lowering or raising pedestal 234 as well as by regulating the amount of metal melt 240 supplied to growth chamber 232. For example, pedestal 234 can be lowered at a rate which corresponds to the rate at which MN molecules from MN surfactant monolayer 246 join surface 250 of seed crystal 238 and grow a crystal (not shown) epitaxially, thereby maintaining the distance shown by line 244.

System 230 can be used to grow bulk crystals which have substantially no defects as only the surface of seed crystal 238 which faces MN surfactant monolayer 246 is used to grow crystals. For example, suppose system 230 is used to grow single GaN crystals. In such an example, metal melt 240 will be a gallium melt and nonmetal gas 242 will be nitrogen gas or a nitrogen plasma. Seed crystal 238 will be a defectless nanopillar having at least two types of surfaces, a first type of surface referred to as an m-plane and a second type of surface referred to as a c-plane. A surface 250 represents one of six m-planes of seed crystal 238 whereas a surface 252 represents one of two c-planes of seed crystal 238 which may be a nanopillar. In this example, the seed crystal is placed on pedestal 234 such that one of its m-planes is parallel to MN surfactant monolayer 246. GaN strip crystals can then be grown on that m-plane of seed crystal 238. The thin strip of crystals grown on one of the m-planes of the nanopillar can then be rotated 90 degrees and growth can continue on one of the c-planes of the seed crystal. The above described procedures can be repeated at desired planes of the seed crystal until a sufficiently large seed crystal is attained. Depending on the amount of time GaN crystals are grown on seed crystal 238 on one of its m-planes, a single GaN crystal which is substantially defect free can be grown. Placing this square sheet of single GaN crystals on one of its c-planes, a substantially endless bulk of GaN crystals can then be grown. As mentioned above, the temperatures of seed crystal 238 and metal melt 240 are below the minimum temperature required for dissolving GaN molecules in a Ga melt, therefore according to this example, bulk GaN crystals can be grown at a substantially low temperature as compared with prior art techniques for growing bulk GaN crystals, for example at 300° C.

Reference is now made to FIG. 3B which is a schematic illustration of another system for growing a metal-nonmetal compound crystal using the method of FIG. 1, generally referenced 260, constructed and operative in accordance with a further embodiment of the disclosed technique. System 260 includes a growth chamber 262, a first gas inlet 264 and a second gas inlet 266. Growth chamber 262 may be a high vacuum growth chamber. System 260 represents a system for growing crystals from a thin film, also known as thin film epitaxy. A seed crystal 272 is placed in growth chamber 262. Seed crystal 272 may itself be placed on a substrate (not shown) which is placed in growth chamber 262. Growth chamber 262 is filled simultaneously with a metal vapor, shown by an arrow 268 and a nonmetal vapor, shown by an arrow 270. Metal vapor 268 and nonmetal vapor 270 co-deposit on the upper surface (not labeled) of seed crystal 272, thereby simultaneously forming a thin liquid metal wetting layer 274 and an MN surfactant monolayer 276 including metal-nonmetal molecules formed from metal vapor 268 and nonmetal vapor 270. According to the disclosed technique, the MN molecules in MN surfactant monolayer 276 tunnel towards the surface of seed crystal 272 thereby growing a MN crystal on seed crystal 272. Known methods can be used to regulate the amount of metal vapor 268 and nonmetal vapor 270 in growth chamber 262. In general, according to the disclosed technique, the concentration of metal vapor 268 at the start of growth procedures used in system 260 should be higher than the equivalent concentration of nonmetal vapor 270 in growth chamber 262, such that thin liquid metal wetting layer 274 is formed. For example, if a one nanometer thick liquid metal wetting layer is desired then an additional metal deposition rate of 0.1 angstroms per second for 100 seconds needs to be supplied at the start of the growth procedures. Thereafter a stoichiometric balance point between the metal vapor and the nonmetal vapor can be returned to. As mentioned above, the thickness of thin liquid metal wetting layer 274 needs to be regulated such that its remains generally constant as per the disclosed technique during crystal growth. As is known to those skilled in the art, at high temperatures thin liquid metal wetting layer 274 may slowly return to a vapor state, therefore any loss in thickness of thin liquid metal wetting layer 274 must be compensated for by an incremental addition of metal vapor 268 to growth chamber 262.

Reference is now made to FIG. 4A which is a schematic illustration of a crystal grown epitaxially, generally referenced 300, constructed and operative in accordance with another embodiment of the disclosed technique. FIG. 4A shows how crystals grown according to the disclosed technique grow in monolayers in which individual molecules couple with a growing crystal. FIG. 4A shows a crystal (not labeled) being grown epitaxially in four different stages. The four different stages are labeled sequentially 302A, 302B, 302C and 302D. Each crystal is shown as being comprised of a plurality of squares 304, where each square 304 represents a repeated pattern in the composition of the crystal. Each square 304 may represent a molecule which couples with the crystal. As shown in stage 302A, the crystal exhibits a terrace 306 which is an energy favorable site for a molecule to couple with the crystal and in particular to tunnel from a surfactant monolayer (not shown) to the crystal. In stage 302B, a molecule 308 has coupled with the crystal at terrace 306. In stage 302C, a molecule 310 has coupled with the crystal at the next available terrace (not labeled). In stage 302D, a molecule 312 has coupled with the crystal at the next available terrace (not labeled). As shown, the crystal is formed molecule by molecule as molecules in the surfactant monolayer tunnel towards the surface of the growing crystal. This enables a crystal to grow epitaxially with substantially no defects.

Figure 4B:
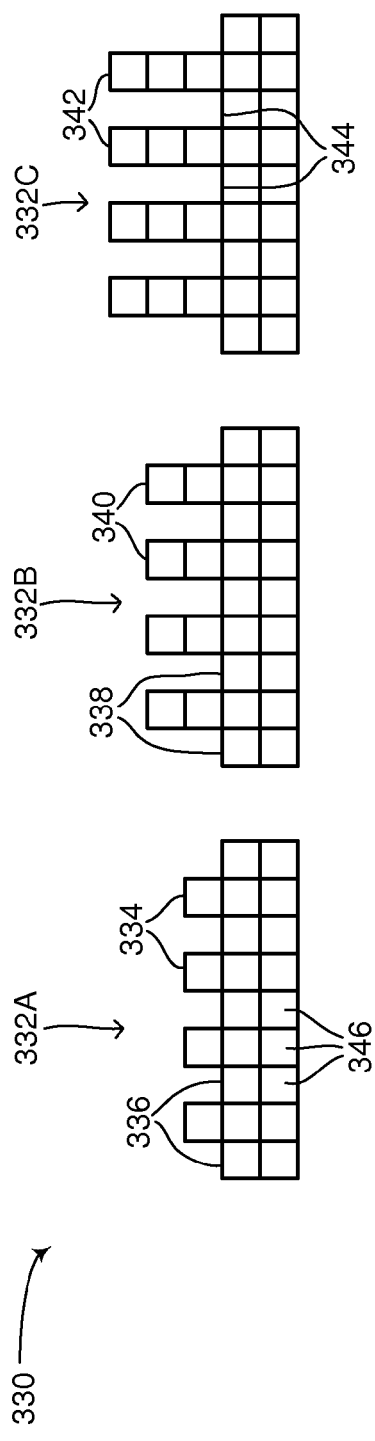
FIG. 4B is a schematic illustration of a crystal grown epitaxially exhibiting a Manhattan structure, constructed and operative in accordance with a further embodiment of the disclosed technique.

Reference is now made to FIG. 4B which is a schematic illustration of a crystal grown epitaxially exhibiting a Manhattan structure, generally referenced 330, constructed and operative in accordance with a further embodiment of the disclosed technique. FIG. 4B shows a crystal (not labeled) being grown epitaxially in three different stages. The three different stages are labeled sequentially 332A, 332B and 332C. Each crystal is shown as being comprised of a plurality of squares 346, where each square 346 represents a repeated pattern in the composition of the crystal. Each square 346 may represent a molecule which couples with the crystal. As shown in stage 332A, the crystal includes a plurality of peaks 334 and a plurality of troughs 336. The crystal can be etched or scribed using known techniques to give it the structure shown in stage 332A. According to the disclosed technique only sections of the crystal which are substantially close to an upper level of a thin liquid metal wetting layer (not shown) will continue to grow by molecules tunneling from a surfactant monolayer (not shown). In stage 332B, a plurality of peaks 340 has grown another molecule high whereas a plurality of troughs 338 has not since plurality of troughs 338 are too far from the upper level of the thin liquid metal wetting layer to have a molecule tunnel to the crystal at that section. In stage 332C, a plurality of peaks 342 has grown a further molecule high whereas a plurality of troughs 344 has not since plurality of troughs 344 are too far from the upper level of the thin liquid metal wetting layer to have a molecule tunnel to the crystal at that section. As mentioned above, the thin liquid metal wetting layer is regulated to be slightly above the top of plurality of peaks 334, 340 and 342. As shown clearest in stage 332C, the disclosed technique enables a crystal to be grown to form a Manhattan structure which includes a plurality of high peaks, or thin walls, interspersed by a plurality of open vias or 'streets.' The crystal of FIG. 4B may exhibit a mesa structure (not shown).

Figure 4C:
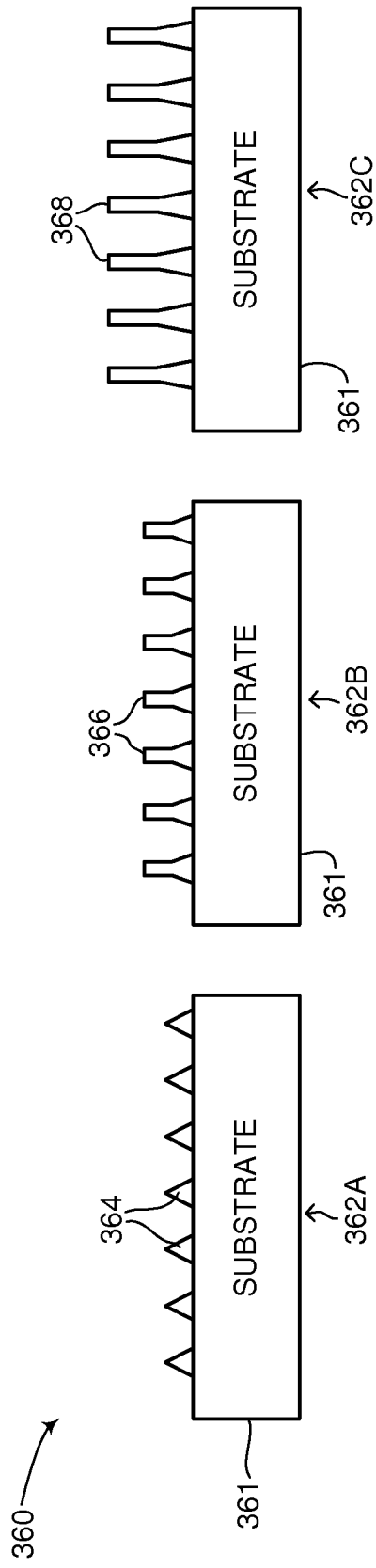
FIG. 4C is a schematic illustration of a crystal grown epitaxially exhibiting a nanowire structure, constructed and operative in accordance with another embodiment of the disclosed technique.

Reference is now made to FIG. 4C which is a schematic illustration of a crystal grown epitaxially exhibiting a nanowire structure, generally referenced 360, constructed and operative in accordance with another embodiment of the disclosed technique. FIG. 4C shows a substrate 361 upon which a plurality of seed crystals 364 are grown. FIG. 4C shows three different stages of growth, sequentially labeled 362A, 362B and 362C. Substrate 361 may be crystalline or amorphous in structure, while plurality of seed crystals 364 is crystalline in structure. Substrate 361 initially exhibits a pyramidal geometry, as shown in stage 362A, where a plurality of short pyramids are shown representing plurality of seed crystals 364. Substrate 361 can be etched or scribed to generate the seed crystal geometry shown in stage 362A. According to the disclosed technique, the plurality of short pyramids represents an energy favorable site for molecules from a surfactant monolayer (not shown) to join plurality of seed crystals 364. The entire upper surface of substrate 361 is covered by a thin liquid metal wetting layer (not shown) yet only the peaks of plurality of seed crystals 364 will grow as they are the closest to a surfactant monolayer (not shown) which rests on top of the thin liquid metal wetting layer. As shown in stages 362B and 362C, plurality of seed crystals 364 has grown into a plurality of nanowires 366 and 368 respectively, wherein regulation of the thin liquid metal wetting layer encourages molecules from the surfactant monolayer to only couple with the peaks of the plurality of short pyramids. As in FIG. 4B, the growth of the peaks of the plurality of short pyramids leaves a plurality of interspersed troughs (not labeled) or open vias.

With reference back to FIGS. 1 and 2A-2C, the disclosed technique provides for a number of novel uses and crystal structures that can be grown. For example, the disclosed technique can be used to grow a monocrystalline structure on non-regular substrates, such as substrates that exhibit curved or rounded surfaces. The method of FIG. 1 can be used with an intermediate pressure CVD growth chamber to grow epitaxial layers on curved surfaces like crystalline fibers or seeded optical quartz crystal fibers as a uniform pressure will exist throughout the CVD growth chamber including the curved surfaces. Using the method of FIG. 1, on a crystalline fiber, a selected metal sheet co-deposited with a nonmetal component can be grown for wetting the surface of the crystalline fiber (procedures 102 and 104, both of FIG. 1). Thereafter, by modifying the rate of deposition of the selected metal a stoichiometric balance point for the growth of a buffering surfactant layer can be achieved (procedure 106 of FIG. 1), thus enabling epitaxial layer by layer growth of a crystal on the crystalline fiber. As another example, a $YBa_2Cu_3O_7$ high temperature (herein abbreviated HTc) superconductor can be grown on a sapphire crystalline fiber using the disclosed technique at a low temperature, as the metal mixture of Y (yttrium), Ba (barium) and Cu (copper) may have a relatively low eutectic melting point. As a further example, in the case of quartz fibers, a seed layer can be grown on a quartz fiber at vapor solid conditions without a metal sheet. Then, using the method of FIG. 1, a metal deposition rate can be increased to higher than a stoichiometric balance point thus forming a metal sheet and metal wetting layer on the seed layer. Afterwards, the metal deposition rate can be reduced to the stoichiometric balance point thus enabling nanocolumns to grow and extend out of the quartz fiber in a radial direction.

As mentioned above, the disclosed technique enables crystals exhibiting a monocrystalline structure to be grown at significantly lower temperatures that prior art methods for monocrystalline growth. The growth temperature used in the disclosed technique can in principle be only slightly higher than the melting temperature of the metal or metal mixture introduced in procedure 102 (FIG. 1). For example, sapphire, which is an aluminum oxide crystal, is grown using the prior art Czochralski method at 2050° C. while according to the disclosed technique can be grown at 680° C.

In addition, the disclosed technique enables only a specific plane of a seed crystal to be grown such that a particular crystallographic orientation of growth can be selected. As explained above in FIGS. 2A-2C, the precursor material for crystal growth according to the disclosed technique is substantially MN molecules in an MN surfactant monolayer which is situated at a relatively close distance to the surface of a seed crystal. Therefore, only the plane of the seed crystal which is relatively close to the MN surfactant monolayer will undergo crystal growth according to the disclosed technique. In prior art methods of crystal growth, like crystal growth from a metal melt or crystal growth from a solution, a seed crystal is immersed in a liquid such that precursor molecules approach the seed crystal from all sides. In these prior art methods, the crystal grows according to the natural, thermodynamically prescribed growth rate of each surface or plane of the seed crystal. Using the disclosed technique, reactive precursor molecules are thermodynamically not allowed to approach the growing crystal from any side except for the side, or plane that is in close proximity to the surfactant monolayer. This difference enables specific planes of a crystal to be grown which may be useful for specific crystal applications. For example, the m-plane of GaN is particularly useful in the construction of transistors since it does not exhibit any piezoelectric properties which can attract high electrical fields that are detrimental for carrier mobility. According to the disclosed technique, a seed crystal can be cut and prepared in such a way that the desired plane, such as the m-plane in GaN, will be parallel and in close proximity to the surfactant monolayer. In the case of prior art MBE methods for crystal growth, even though precursor materials are supplied from only one direction and crystals are grown in that specific direction, when nanocolumns are grown using known MBE methods, approaching metal atoms can couple with the growing crystal indiscriminately and can deposit between the nanocolumns in the troughs. This may result in side crystal growth as well as in a thickening of the nanocolumns. Very high temperatures may avoid this issue in these prior art MBE methods. According to the disclosed technique, crystal growth in the troughs of nanocolumns is avoided, even at lower temperatures, since the precursor materials only deposit on the upper surface of the nanocolumns that are in close proximity to the surfactant monolayer.

The disclosed technique enables crystals to be grown at ideal conditions for high quality crystals having substantially no defects or dislocations. In general, crystal growth in a liquid is substantially calmer and less temperature dependent than other methods of crystal growth, such as MBE, since approaching precursors molecules can drift and float on the crystalline surface of the growing crystal to an optimal site for their incorporation into the growing lattice of the crystal structure. This optimal placement of precursor materials in the growing lattice results in high quality monolayers of crystal growth and thus ultimately in a superior crystal. The disclosed technique enables crystals to be grown in a liquid, as described above, as well as to be grown in an environment where a stoichiometric balance point is achieved between the precursor materials. In general, a stoichiometric balance point is more easily achieved in a liquid, as provided by the disclosed technique. As is known, highest quality electro-optical GaN films and nanocolumns are grown in gallium-rich environments which can be better controlled in a liquid growth environment.

Also according to the disclosed technique, complex alloys can be used in crystal growth and grown crystals can also be doped. For example, ternary alloys such as indium gallium nitride and cadmium zinc selenide can be used as precursor materials for crystal growth at low temperatures since metal mixtures tend to have low eutectic melting points. The non-metal atoms and particles used as a precursor material can also be complex according to the disclosed technique, such as gallium phosphor arsenide or zinc oxide telluride. As such, the disclosed technique provides for a method of crystal growth using very uncommon metal and nonmetal compounds. Furthermore, the proximity of the precursor materials to the growing surface of the crystal makes it much easier to dope the growing surface, which may be a semiconductor film, with n-type or p-type impurities. In addition, doping the growing surface at low temperatures substantially reduces the thermal budget of the crystal which normally causes a high diffusion distance of the dopants and also affects the desired concentration of the dopants.

According to another embodiment of the disclosed technique, different layers in a grown crystal can include different compositions as well as different gradients or transitions of precursor materials from one layer to the next. For example, a seed crystal of $Al_2O_3$ (aluminum oxide) can be used to grow a first layer of AlN (aluminum nitride) followed by a second layer of GaN using the disclosed technique. Each layer may be transitioned to another layer by controlling the deposition rate of each metal, thus the AlN layer may be gradually transitioned to the GaN layer or may be transitioned in a sharp manner by changing the deposition rate of aluminum or gallium. In general, the only restriction regarding this embodiment of the disclosed technique is that the various layers grown should have a similarity in lattice structure thereby avoiding misfit dislocations in the grown crystal. In accordance with this embodiment, the surfactant monolayer which serves as the precursor material for crystal growth can be gradually altered to enable the growth of thin films with a graded composition. The metal and nonmetal precursor materials which constitute the surfactant monolayer can be altered by changing the deposition rate of each. Such thin films with a graded composition may be used to construct a graded direct bandgap semiconductor. Such a semiconductor may be used to collect solar energy over a wide spectrum of solar emissions where each color present in a solar emission is collected by a layer in the semiconductor having a corresponding bandgap. Examples of such layers may include monolayers having generalized formulas such as $In_xGa_{1-x}N$, $Al_xGa_{1-x}As$, $GaAs_xN_{1-x}$ and the like. In other embodiments of the disclosed technique, the various layers grown should have a similarity in lattice structure yet misfit dislocations may be encouraged in order to grow nanocolumns.

The disclosed technique further enables uncommon crystal structures to be grown at low and steady temperatures. For example, when depositing InGaN (indium gallium nitride) by MBE methods, care has to be taken regarding the growth temperature of the system since GaN dissociates at 800° C. whereas InN (indium nitride) dissociates at 550° C. At low temperatures, epitaxy will not occur whereas at high temperatures InN will not be incorporated into a growing lattice since it will dissociate. Using the disclosed technique, InGaN can be grown at 50° C. Therefore, according to the disclosed technique, new precursor materials not considered for crystal growth may be used in crystal growth as temperature incompatibilities of certain alloys and mixtures can be avoided.

The disclosed technique also enables heterocrystalline structures to be grown, as the disclosed technique can be used to grow crystals heteroepitaxially. For example, regarding thin film growth systems, as shown above in FIG. 3B, a thin liquid metal wetting layer can be provided with various types of nonmetal particles at different times, such as first nitrogen, then phosphorus and finally arsenide. The varying nonmetal particles will change the composition of the surfactant monolayer which in turn will change the composition of the grown crystal, thus enabling heteroepitaxy. As another example, the thin liquid metal wetting layer of a given metal can be dried according to the disclosed technique and a new thin liquid metal wetting layer, composed of a different metal, can then be deposited on the growing crystal. Alternatively, different metals can be introduced into the growth environment while the thin liquid metal wetting layer is being deposited on the seed crystal to enable heteroepitaxy. As mentioned above, various layers of crystal growth grown on the seed crystal can be dried upon which new layers of crystals can be grown or a given crystal layer can have its composition changed by changing the precursor MN molecules of the surfactant monolayer.

As described above in FIGS. 4B and 4C, the disclosed technique enables novel structures of crystals to be grown, such as nanocolumns or Manhattan structures. Using prior art crystal growth techniques, when precursor materials in a liquid or gas state are deposited as a thin film on a seed crystal having a non-flat surface, the thin film usually conforms to the topology of the non-flat surface and results in a non-flat grown crystal. As described above, MBE methods and CVD methods can result in crystal growth exhibiting a pyramidal geometry and can lead to the growth of nanocolumns although as more atoms and particles are deposited using such methods, any nanocolumns grown start to thicken and troughs between grown nanocolumns begin to fill up. According to the disclosed technique, troughs between grown nanocolumns are kept clean of particle deposits since precursor molecules will only jump or tunnel to adjacent surfaces in the vicinity of the surfactant monolayer.

It will be appreciated by persons skilled in the art that the disclosed technique is not limited to what has been particularly shown and described hereinabove. Rather the scope of the disclosed technique is defined only by the claims, which follow.

The invention claimed is:
1. A method for crystal growth from a surfactant of a metal-nonmetal (MN) compound, comprising the procedures of:
   providing a seed crystal;
   setting a temperature of said seed crystal below a minimal temperature required for dissolving MN molecules in a thin liquid metal wetting layer and above a melting point of a first metal, each one of said MN molecules being formed from at least one atom of a second metal and at least one atom of a first nonmetal;

introducing atoms of said first metal to said seed crystal in order to form said thin liquid metal wetting layer on at least one surface of said seed crystal, said thin liquid metal wetting layer having at least two monolayers and being spread over substantially the whole surface of said at least one surface of said seed crystal;

introducing said MN molecules which form an MN surfactant monolayer, thereby facilitating a formation of said thin liquid metal wetting layer between said MN surfactant monolayer and said at least one surface of said seed crystal; and regulating a thickness of said thin liquid metal wetting layer such that at least some of said MN molecules of said MN surfactant monolayer couple with said at least one surface of said seed crystal, thereby growing an epitaxial layer of said MN compound on said seed crystal, wherein said MN surfactant monolayer has a metallophilic side facing said thin liquid metal wetting layer and a metallophobic side facing away from said thin liquid metal wetting layer.

2. The method according to claim 1, further comprising the procedure of sputtering an MN compound target for introducing said MN molecules which form said MN surfactant monolayer.

3. The method according to claim 1, wherein said seed crystal is formed from a third metal and a second nonmetal.

4. The method according to claim 3, wherein said first metal, said second metal and said third metal are identical.

5. The method according to claim 3, wherein said first nonmetal and said second nonmetal are identical.

6. The method according to claim 1, wherein said first metal and said second metal are each metal elements from the periodic table of elements classified as a metal selected from the list consisting of:
   an alkali metal;
   an alkaline earth metal;
   a transition metal;
   a lanthanide element;
   an actinide element; and
   an other metal.

7. The method according to claim 1, wherein said first nonmetal is a nonmetal element from the periodic table of elements classified as a nonmetal selected from the list consisting of:
   a nonmetal; and
   a halogen.

8. The method according to claim 1, wherein said seed crystal is selected from the list consisting of:
   a homogeneous crystal in relation to said MN compound;
   a heterogeneous crystal in relation to said MN compound;
   a small crystallite grown on an amorphous substrate; and
   a small crystallite grown on a crystalline substrate.

9. The method according to claim 1, wherein said procedure of regulating said thickness comprises a sub procedure selected from the list consisting of:
   regulating said thickness using an evaporation controller for controlling a rate of evaporation of said MN molecules;
   regulating said thickness using a gas inlet manometer and a photo spectrometer; and
   regulating said thickness using a droplet criterion and a reflection high energy electron diffraction (RHEED) technique.

10. The method according to claim 1, wherein said procedure of setting said temperature comprises the sub-procedure of determining an optimal temperature for said seed crystal wherein an incorporation rate of said MN molecules is maximized and a stoichiometric balance point of a MN precursor material can be regulated.

11. The method according to claim 1, further comprising the procedures of:
    ceasing the introduction of said atoms of said first metal such that said thin liquid metal wetting layer dries up; and
    growing a crystal layer of said MN compound exhibiting a polycrystalline structure over said epitaxial layer of said MN compound on said seed crystal.

12. The method according to claim 1, further comprising the procedures of:
    slowing an introduction of atoms of said first nonmetal until ceased, thereby leaving a thin layer of said atoms of said first metal on said epitaxial layer of MN compound; and
    removing said thin layer of said atoms of said first metal.

13. The method according to claim 12, wherein said procedure of removing comprises a sub-procedure selected from the list consisting of:
    evaporating said thin layer by heating said seed crystal;
    etching said thin layer using wet chemistry techniques; and
    etching said thin layer using plasma chemistry techniques.

14. The method according to claim 1, wherein said thin liquid metal wetting layer is a portion of a metal solution surrounding said seed crystal.

15. The method according to claim 1, wherein said thin liquid metal wetting layer has a thickness of up to 3 nanometers.

16. The method according to claim 1, wherein said MN surfactant monolayer comprises up to three monolayers, each one of said three monolayers having a thickness of substantially 0.3 nanometers.

17. A method for crystal growth from a surfactant of a metal-nonmetal (MN) compound from a metal melt in a growth chamber, said growth chamber comprising a pedestal, located inside said growth chamber and a motor, coupled with said pedestal, for moving said pedestal in said growth chamber, comprising the procedures of:
    placing a seed crystal on said pedestal such that a growth surface of said seed crystal faces opposite a direction of said pedestal;
    filling said growth chamber with said metal melt such that said growth surface is covered by a thin layer of said metal melt, said thin layer of said metal melt having at least two monolayers;
    introducing a nonmetal gas into said growth chamber above a surface of said metal melt, wherein particles of said nonmetal gas and particles of said metal melt interact, thereby forming a MN surfactant monolayer; and
    regulating a distance between said growth surface and said MN surfactant monolayer such that molecules in said MN surfactant monolayer tunnel to said growth surface, thereby epitaxially growing at least one crystal layer on said growth surface,
    wherein said MN surfactant monolayer has a metallophilic side facing said thin liquid metal wetting layer and a metallophobic side facing away from said thin liquid metal wetting layer.

18. The method according to claim 17, wherein said distance is regulated by said motor moving said pedestal such that said growth surface is covered by said thin layer of said metal melt.

19. A method for epitaxial crystal growth from a surfactant of a metal-nonmetal (MN) compound from a thin film in a growth chamber, said growth chamber comprising a metal source, coupled with said growth chamber, for introducing a metal vapor into said growth chamber, and an inlet, coupled with said growth chamber, for introducing a nonmetal vapor into said growth chamber, comprising the procedures of:

placing a seed crystal in said growth chamber;
simultaneously filling said growth chamber with said metal vapor and said nonmetal vapor, such that said metal vapor and said nonmetal vapor co-deposit on a growth surface of said seed crystal, thereby forming a thin liquid metal wetting layer from said metal vapor and a MN surfactant monolayer over said thin liquid metal wetting layer, said thin liquid metal wetting layer having at least two monolayers and being spread over substantially the whole surface of said growth surface of said seed crystal; and
regulating a thickness of said thin liquid metal wetting layer such that MN molecules in said MN surfactant monolayer tunnel to said growth surface, thereby epitaxially growing at least one crystal layer on said growth surface,
wherein a concentration of said metal vapor is initially higher than a concentration of said nonmetal vapor such that said thin liquid metal wetting layer is formed, and
wherein said MN surfactant monolayer has a metallophilic side facing said thin liquid metal wetting layer and a metallophobic side facing away from said thin liquid metal wetting layer.

20. The method according to claim 19, wherein said metal source is selected from the list consisting of:
a Knudsen cell; and
an evaporation crucible.

21. The method according to claim 19, wherein said inlet is selected from the list consisting of:
a gas inlet; and
a plasma inlet.

22. The method according to claim 1, further comprising the procedure of vaporizing said at least one atom of said first nonmetal until said MN surfactant monolayer is formed.

23. The method according to claim 1, further comprising the procedure of vaporizing an MN precursor for introducing said MN molecules which form said MN surfactant monolayer.

24. The method according to claim 3, wherein said first metal, said second metal and said third metal are different.

25. The method according to claim 3, wherein at least two of said first metal, said second metal and said third metal are identical.

26. The method according to claim 3, wherein said first nonmetal and said second nonmetal are different.

27. The method according to claim 1, wherein said seed crystal exhibits a crystallographic structure selected from the list consisting of:
a terraced structure;
a Manhattan structure;
a nanowire structure;
a flat geometrical structure; and
a pyramidal structure.

28. The method according to claim 1, wherein said procedure of introducing said MN molecules comprises the sub procedure of introducing a precursor material in a growth environment required to grow said MN compound using a crystal growth technique.

29. The method according to claim 1, wherein said procedure of introducing atoms of said first metal comprises a sub procedure selected from the list consisting of:
introducing said atoms as a vapor which will eventually condense on said at least one surface of said seed crystal;
introducing said atoms as a liquid metal which surrounds said at least one surface of said seed crystal; and
introducing a compound comprising said first metal and a nonmetal element, in which said compound is dissociated in a vicinity of said seed crystal.

30. The method according to claim 1, wherein said procedure of introducing said MN molecules comprises the sub procedure of co depositing metal particles and nonmetal particles which combine to form said MN molecules.

31. The method according to claim 1, wherein said seed crystal is selected from the list consisting of:
a nanometer sized crystalline seed;
a bulky millimeter sized seed;
a wafer with at least one flat surface;
a wafer with a tip of a crystalline fiber;
a seed crystal coupled with a crystalline material; and
a seed crystal coupled with an amorphous material.

32. The method according to claim 1, wherein said procedure of introducing said atoms of said first metal comprises introducing said atoms in the vicinity of said seed crystal.

33. The method according to claim 1, wherein said procedure of introducing said atoms of said first metal comprises introducing said atoms to contact with said seed crystal.

34. The method according to claim 17, wherein said distance is regulated by adjusting an amount of said metal melt in said growth chamber such that said growth surface is covered by said thin layer of said metal melt.

35. The method according to claim 19, wherein said concentration of said metal vapor is adjusted to regulate said thickness of said thin liquid metal wetting layer.

36. The method according to claim 28, wherein said crystal growth technique is selected from the list consisting of:
chemical vapor deposition (CVD);
molecular beam epitaxy (MBE);
liquid phase epitaxy (LPE);
vapor phase epitaxy (VPE); and
solution growth.

* * * * *